United States Patent
Kang et al.

(10) Patent No.: US 11,923,426 B2
(45) Date of Patent: Mar. 5, 2024

(54) SEMICONDUCTOR DEVICE

(71) Applicant: SAMSUNG ELECTRONICS CO., LTD., Suwon-si (KR)

(72) Inventors: Ji Won Kang, Hwaseong-si (KR); Tae-Yeol Kim, Hwaseong-si (KR); Jeong Ik Kim, Seongnam-si (KR); Rak Hwan Kim, Suwon-si (KR); Jun Ki Park, Hwaseong-si (KR); Chung Hwan Shin, Hwaseong-si (KR)

(73) Assignee: Samsung Electronics Co., Ltd., Suwoni-si (KR)

( * ) Notice: Subject to any disclaimer, the term of this patent is extended or adjusted under 35 U.S.C. 154(b) by 262 days.

(21) Appl. No.: 17/367,988

(22) Filed: Jul. 6, 2021

(65) Prior Publication Data
US 2022/0130970 A1 Apr. 28, 2022

(30) Foreign Application Priority Data
Oct. 23, 2020 (KR) .................. 10-2020-0138144

(51) Int. Cl.
*H01L 29/417* (2006.01)
*H01L 23/522* (2006.01)
(Continued)

(52) U.S. Cl.
CPC .... *H01L 29/41775* (2013.01); *H01L 23/5226* (2013.01); *H01L 23/5283* (2013.01);
(Continued)

(58) Field of Classification Search
CPC .......... H01L 29/41775; H01L 23/5226; H01L 23/5283; H01L 23/53266; H01L 29/0665;
(Continued)

(56) References Cited

U.S. PATENT DOCUMENTS 9,646,932 B2 5/2017 Peng et al.
10,204,828 B1 2/2019 Bao et al.
(Continued)

FOREIGN PATENT DOCUMENTS

KR 101578166 B1 12/2015
KR 20190062132 A 6/2019
(Continued)

*Primary Examiner* — Farun Lu
(74) *Attorney, Agent, or Firm* — Myers Bigel, P.A.

(57) ABSTRACT

A semiconductor device capable of improving a device performance and a reliability is provided. The semiconductor device comprising a gate structure including a gate electrode on a substrate, a source/drain pattern on a side face of the gate electrode, on the substrate and, a source/drain contact connected to the source/drain pattern, on the source/drain pattern, a gate contact connected to the gate electrode, on the gate electrode, and a wiring structure connected to the source/drain contact and the gate contact, on the source/drain contact and the gate contact, wherein the wiring structure includes a first via plug, a second via plug, and a wiring line connected to the first via plug and the second via plug, the first via plug has a single conductive film structure, and the second via plug includes a lower via filling film, and an upper via filling film on the lower via filling film.

20 Claims, 37 Drawing Sheets

(51) Int. Cl.
*H01L 23/528* (2006.01)
*H01L 23/532* (2006.01)
*H01L 29/06* (2006.01)
*H01L 29/423* (2006.01)
*H01L 29/78* (2006.01)

(52) U.S. Cl.
CPC .... *H01L 23/53266* (2013.01); *H01L 29/0665* (2013.01); *H01L 29/41733* (2013.01); *H01L 29/41791* (2013.01); *H01L 29/42392* (2013.01); *H01L 29/7851* (2013.01)

(58) Field of Classification Search
CPC ......... H01L 29/41733; H01L 29/41791; H01L 29/42392; H01L 29/7851; H01L 21/76883; H01L 21/76849; H01L 21/76879; H01L 29/0673; H01L 29/66439; H01L 21/7682; H01L 21/76834; H01L 23/485; H01L 29/516; H01L 21/76224; H01L 29/775; H01L 29/41766; H01L 21/823475; H01L 21/76877; B82Y 10/00
See application file for complete search history.

(56) References Cited

U.S. PATENT DOCUMENTS

| 10,534,273 | B2 | 1/2020 | Yang et al. |
| 10,593,593 | B2 | 3/2020 | Kamineni et al. |
| 2018/0182856 | A1* | 6/2018 | Lee .................. H01L 21/76849 |
| 2018/0366640 | A1* | 12/2018 | Clevenger ............. H10B 61/00 |
| 2019/0148226 | A1* | 5/2019 | Yim .................... H01L 23/5226 257/383 |
| 2019/0385838 | A1 | 12/2019 | Wu et al. |
| 2020/0035556 | A1 | 1/2020 | Kamineni et al. |
| 2020/0098922 | A1 | 3/2020 | You et al. |

FOREIGN PATENT DOCUMENTS

| KR | 102105113 | B1 | 4/2020 |
| KR | 20200035841 | A | 4/2020 |

* cited by examiner

SEMICONDUCTOR DEVICE

CROSS-REFERENCE TO RELATED APPLICATION

This application claims priority from Korean Patent Application No. 10-2020-0138144 filed on Oct. 23, 2020 in the Korean Intellectual Property Office, and all the benefits accruing therefrom under 35 U.S.C. 119, the contents of which in its entirety are herein incorporated by reference.

BACKGROUND

The present disclosure relates to a semiconductor device.

As one example of scaling techniques for increasing the density of semiconductor devices, a multi gate transistor in which a multi-channel active pattern (or silicon body) in the shape of a fin or a nanowire is formed on a substrate, and a gate is formed on the surface of the multi-channel active pattern has been proposed.

Since such a multi-gate transistor utilizes three-dimensional channels, scaling is easily performed. Further, the current control capability may be improved even without increasing a gate length of the multi-gate transistor. Furthermore, it may be possible to effectively suppress a SCE (short channel effect) in which the potential of a channel region is influenced by a drain voltage.

On the other hand, as a pitch size of the semiconductor device decreases, research for obtaining a reduction in capacitance and/or electrical stability between contacts in the semiconductor device may be needed.

SUMMARY

Aspects of the present invention provide a semiconductor device that may improve device performance and/or reliability.

According to some embodiments of the present disclosure, there is provided a semiconductor device including a gate structure including a gate electrode on a substrate, a source/drain pattern on the substrate and on a side face of the gate electrode, and a source/drain contact electrically connected to the source/drain pattern, a gate contact electrically connected to the gate electrode, and a wiring structure electrically connected to the source/drain contact and the gate contact, wherein the wiring structure includes a first via plug, a second via plug, and a wiring line electrically connected to the first via plug and the second via plug, the first via plug has a single conductive film structure, and the second via plug includes a lower via filling film, and an upper via filling film on the lower via filling film.

According to some embodiments of the present disclosure, there is provided a semiconductor device comprising a gate structure on a substrate, the gate structure including a gate electrode and a gate capping pattern on the gate electrode, a source/drain pattern on a side face of the gate electrode, a source/drain contact electrically connected to the source/drain pattern, a gate contact electrically connected to the gate electrode, and a wiring structure electrically connected to the source/drain contact and the gate contact, wherein the wiring structure includes a first via plug electrically connected to the source/drain contact, a second via plug, and a wiring line electrically connected to the first via plug and the second via plug, an upper face of the gate capping pattern is in a same plane as an upper face of the gate contact, the first via plug has a single conductive film structure, and an upper face of the first via plug has a convex curved face.

According to some embodiments of the present disclosure, there is provided a semiconductor device comprising a multi-channel active pattern on a substrate, a gate structure on the multi-channel active pattern, the gate structure including a gate electrode and a gate capping pattern that is on the gate electrode, a source/drain pattern on a side face of the gate structure, a source/drain contact electrically connected to the source/drain pattern, a gate contact electrically connected to the gate electrode, and a wiring structure electrically connected to the source/drain contact and the gate contact, wherein the wiring structure includes a first via plug electrically connected to the source/drain contact, a second via plug, and a wiring line electrically connected to the first via plug and the second via plug, the first via plug includes a single conductive film structure, the second via plug includes a lower via filling film, a via barrier film extending along a bottom face and a side wall of the lower via filling film, and an upper via filling film on the lower via filling film and the via barrier film, the first via plug and the upper via filling film include tungsten (W).

However, aspects of the present invention are not restricted to the one set forth herein. The above and other aspects of the present invention will become more apparent to one of ordinary skill in the art to which the present invention pertains by referencing the detailed description of the present invention given below.

BRIEF DESCRIPTION OF THE DRAWINGS

The above and other aspects and features of the present invention will become more apparent by describing in detail example embodiments thereof referring to the attached drawings, in which.

DETAILED DESCRIPTION

Although the drawings of a semiconductor device according to some embodiments show a fin-type transistor (FinFET) including a channel region of a fin-type pattern shape, a transistor including a nanowire or a nanosheet, and a MBCFET™ (Multi-Bridge Channel Field Effect Transistor), the embodiments described herein are not limited thereto. The semiconductor device according to some embodiments may, of course, include a tunneling FET, or a three-dimensional (3D) transistor. The semiconductor device according to some embodiments may, of course, include a planar transistor. In addition, the technical idea of the present invention may be applied to a transistor (2D material based FETs) based on two-dimensional material and a heterostructure thereof.

Further, the semiconductor device according to some embodiments may also include a bipolar junction transistor, a laterally diffused metal oxide semiconductor (LDMOS), or the like.

The semiconductor device according to some embodiments will be described referring to FIGS. 1 to 5B.

Figure 1:
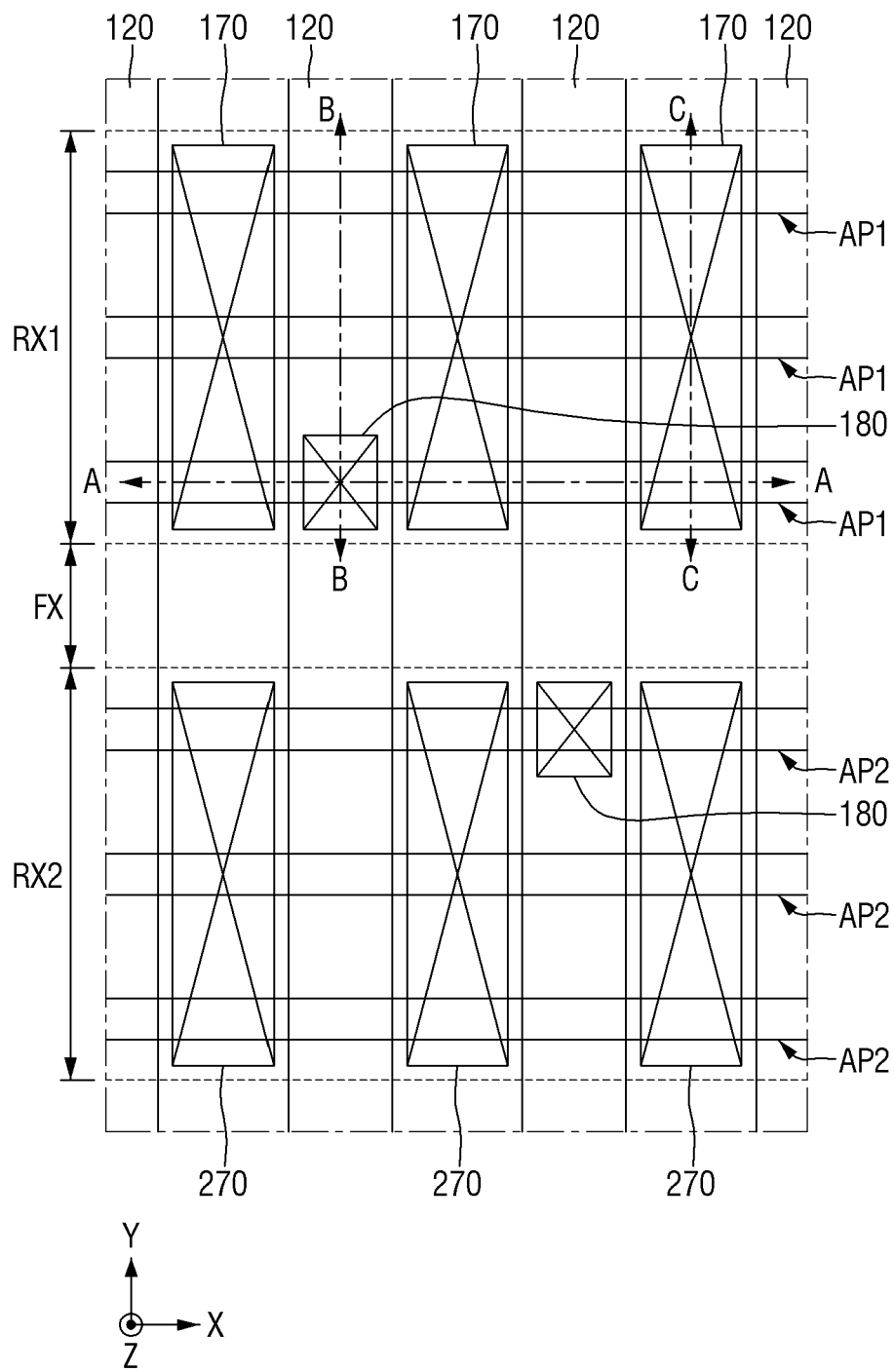
FIG. 1 is an example layout diagram for explaining a semiconductor device according to some embodiments.
Figure 2A:
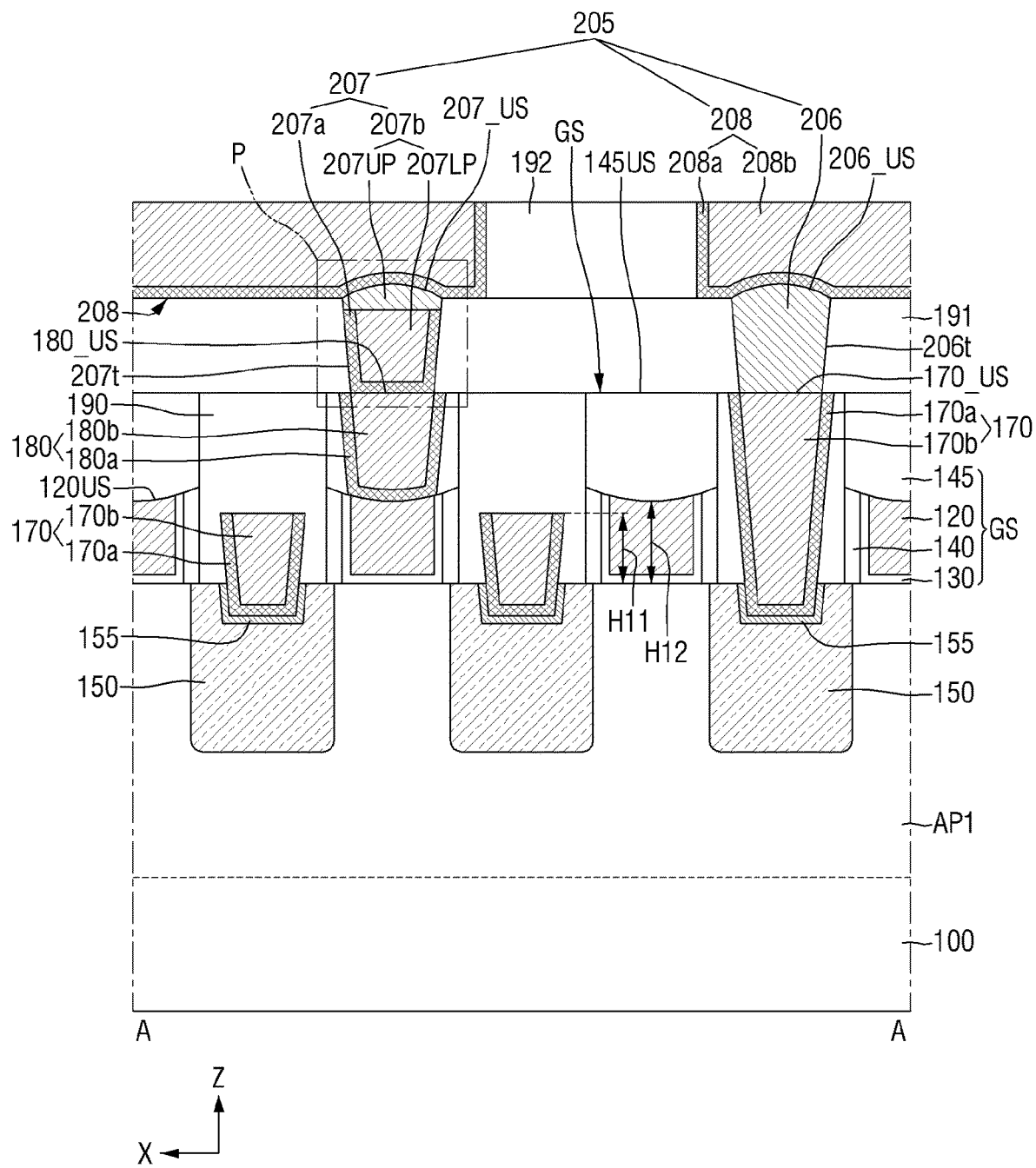
FIGS. 2A and 2B are example cross-sectional views taken along A-A of FIG. 1.
Figure 2B:
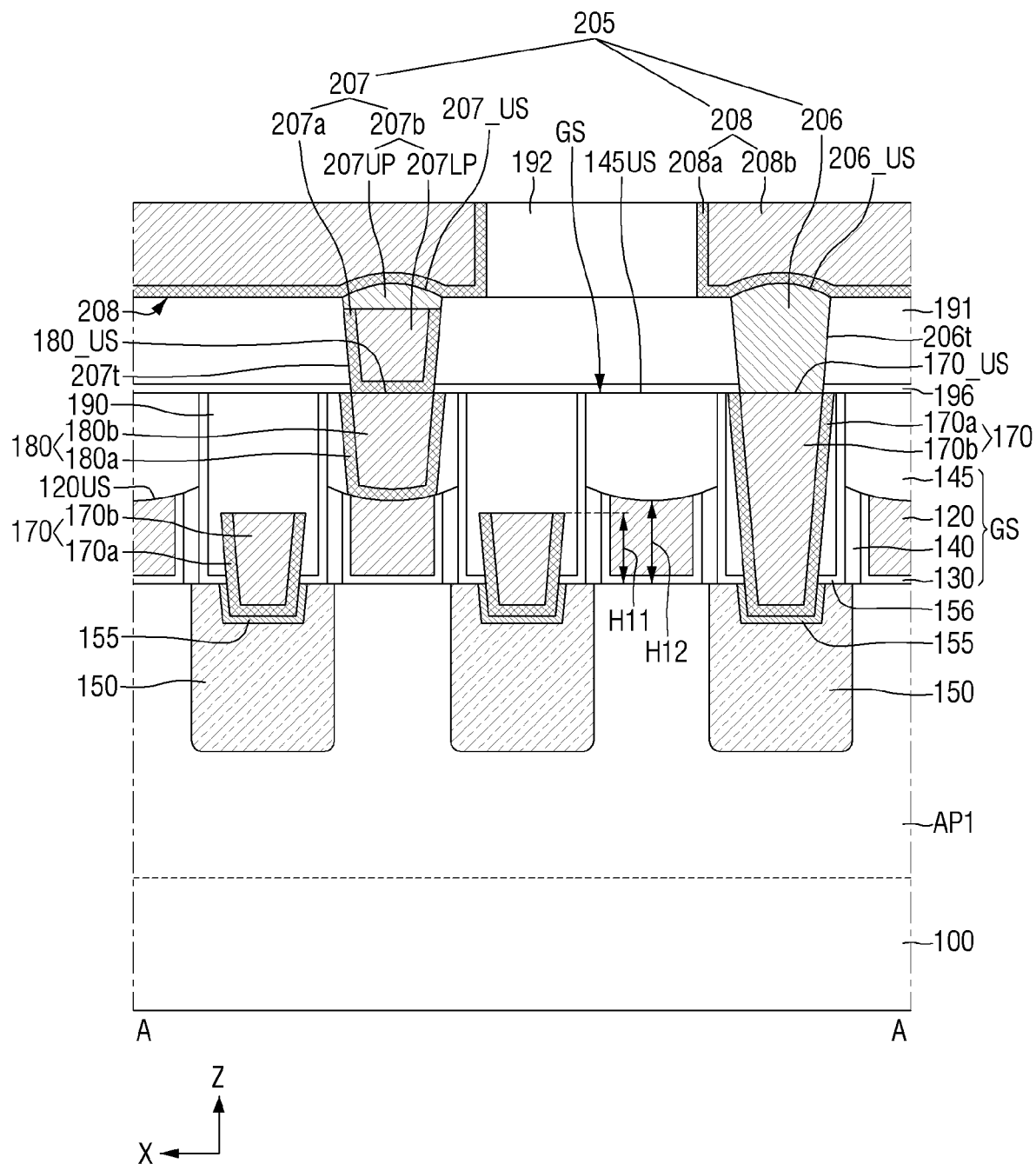
Figure 3:
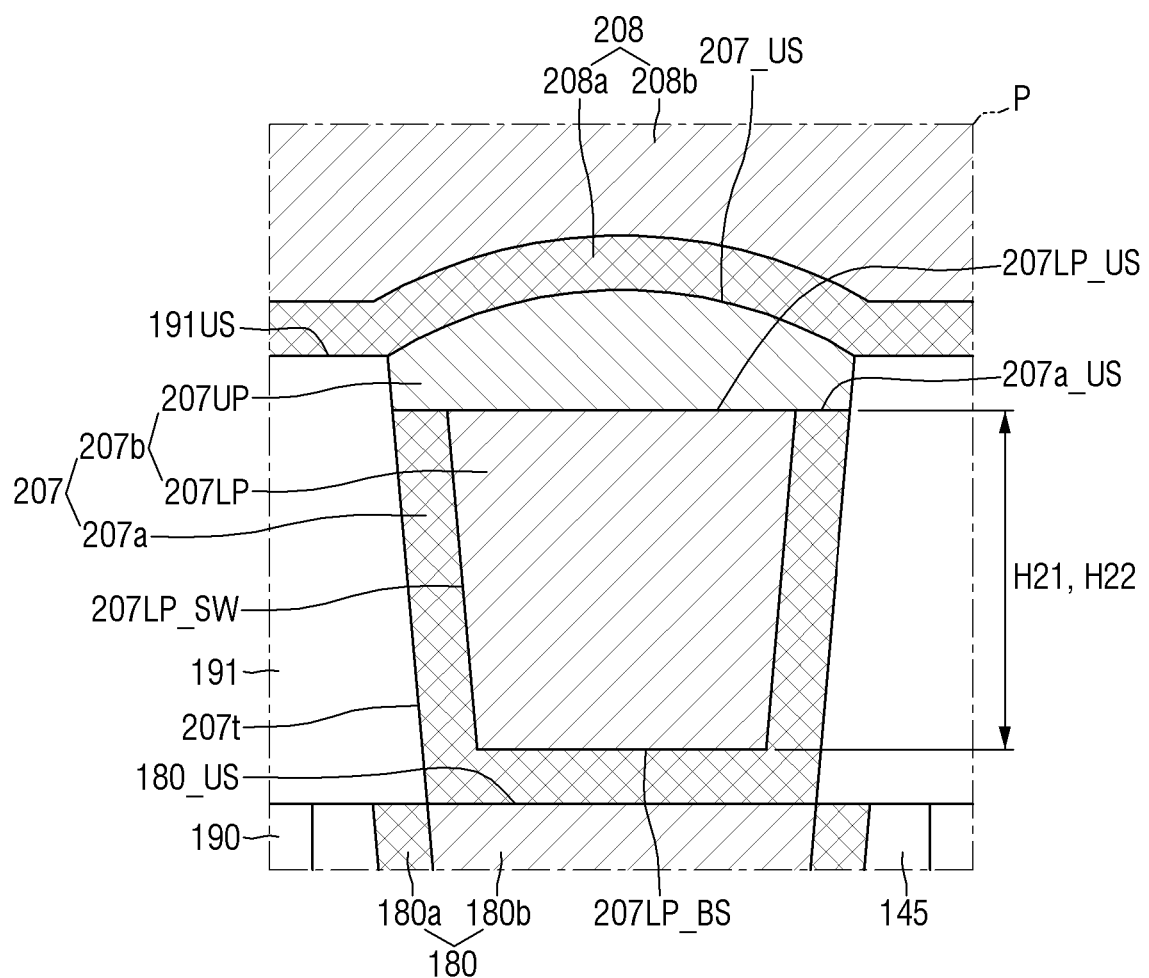
FIG. 3 is an enlarged view of a portion P of FIG. 2A.
Figure 4A:
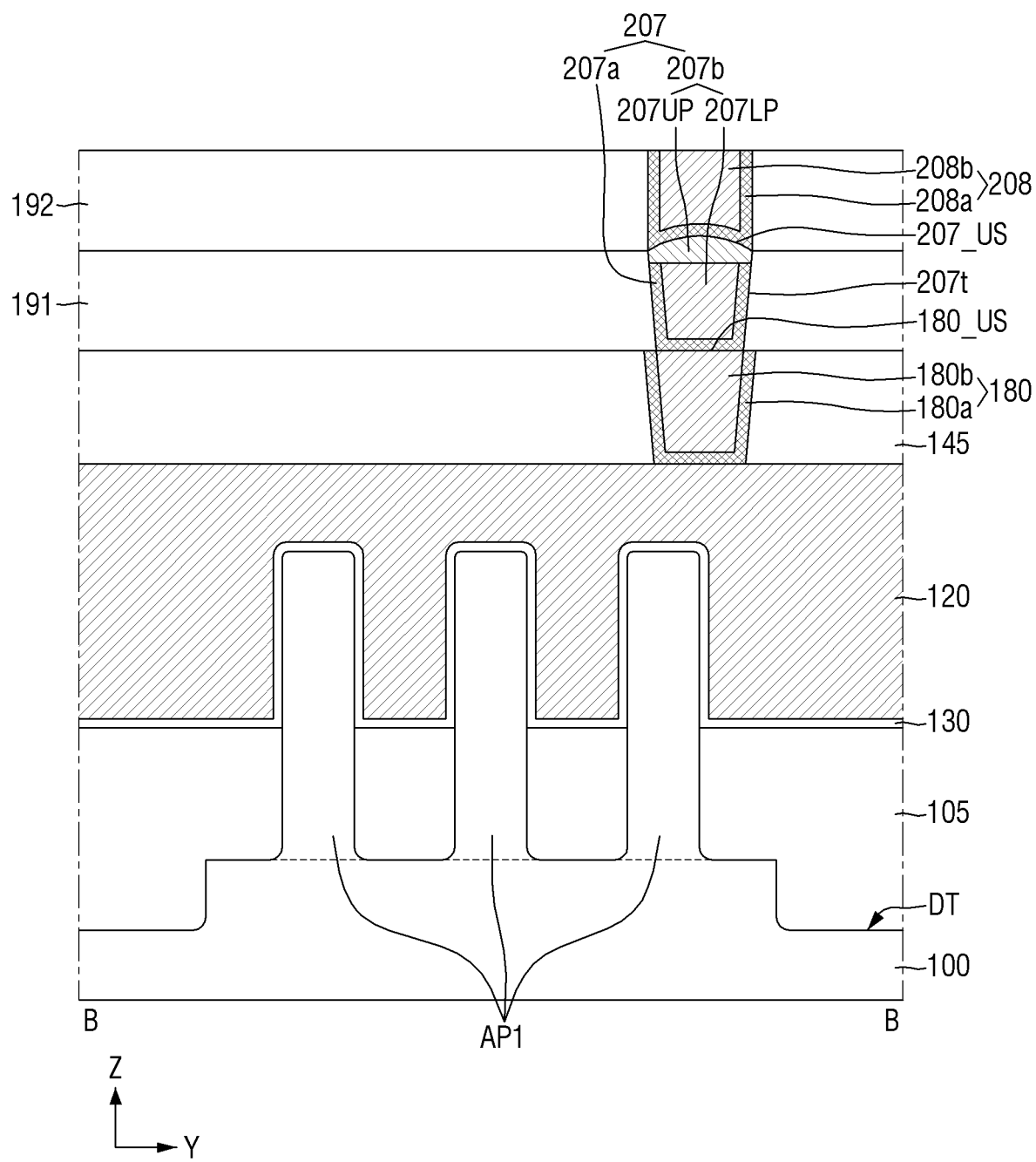
FIGS. 4A and 4B are example cross-sectional views taken along B-B of FIG. 1.
Figure 4B:
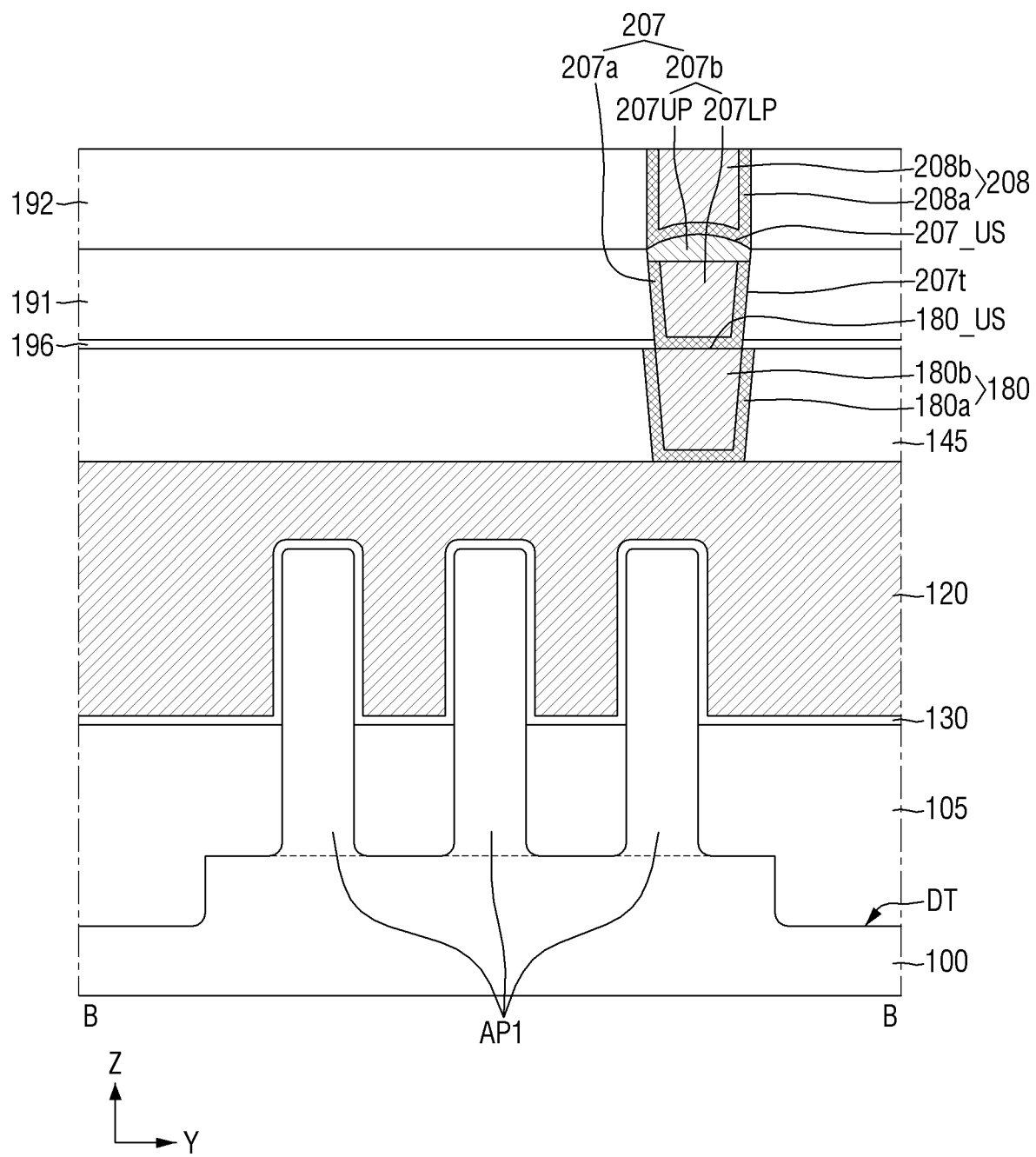
Figure 5A:
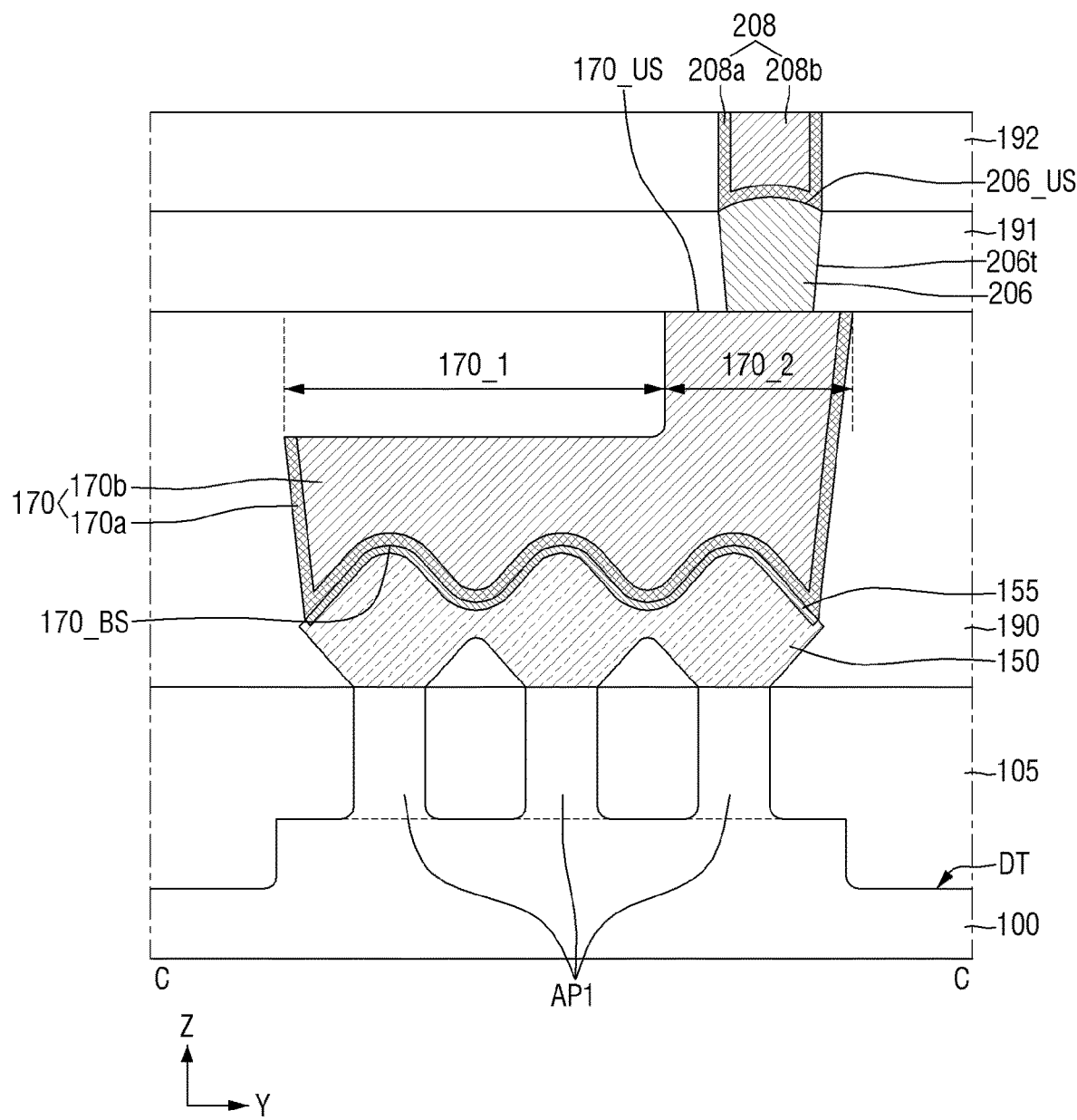
FIGS. 5A and 5B are example cross-sectional views taken along C-C of FIG. 1.
Figure 5B:
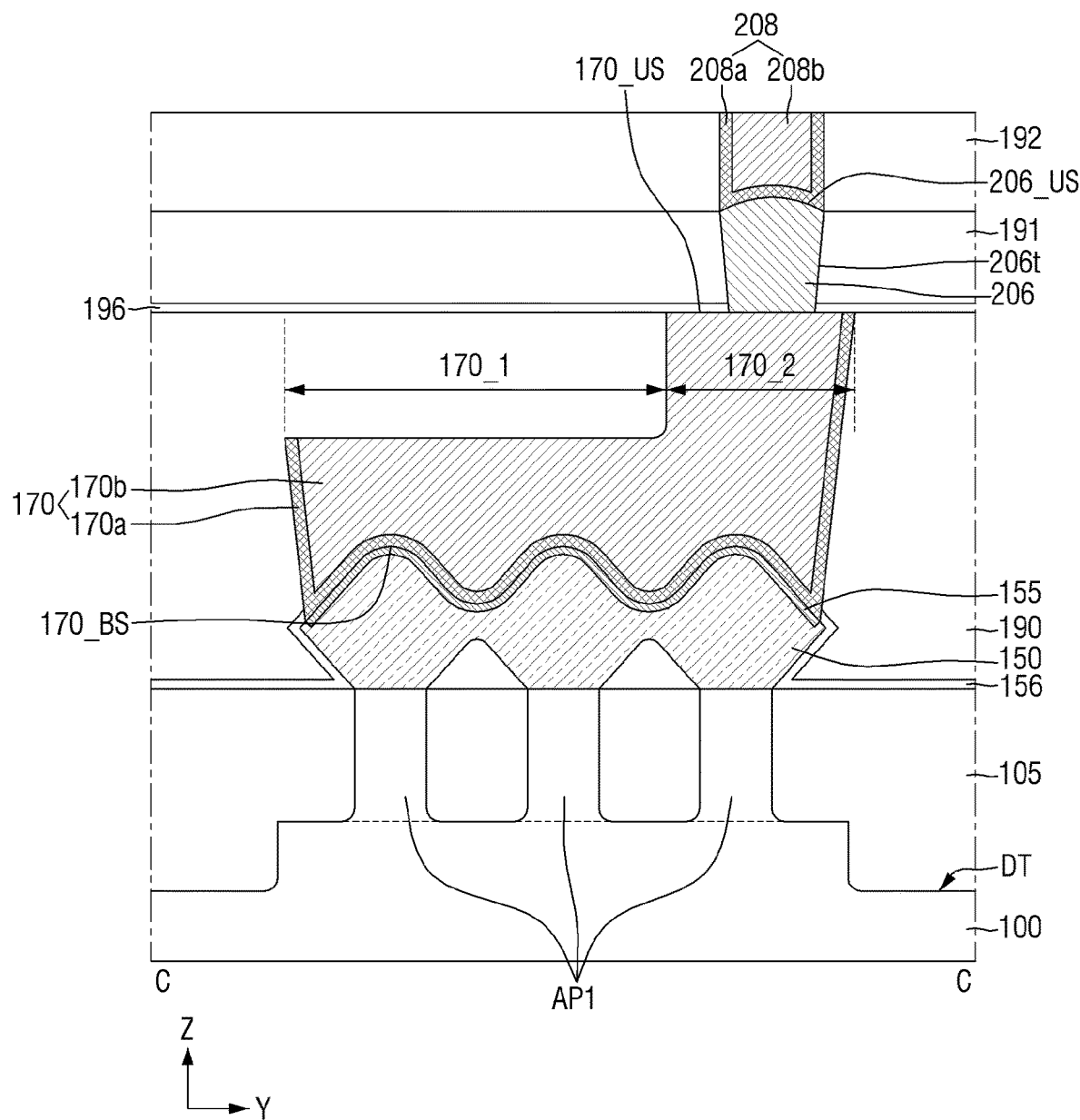

FIG. 1 is an example layout diagram for explaining the semiconductor device according to some embodiments. FIGS. 2A and 2B are example cross-sectional views taken along A-A of FIG. 1. FIG. 3 is an enlarged view of a portion P of FIG. 2A. FIGS. 4A and 4B are example cross-sectional views taken along B-B of FIG. 1. FIGS. 5A and 5B are example cross-sectional views taken along C-C of FIG. 1. For convenience of explanation, a wiring structure 205 is not shown in FIG. 1.

Referring to FIGS. 1 to 5B, the semiconductor device according to some embodiments may include at least one or more first active patterns AP1, at least one or more second active patterns AP2, at least one or more gate electrodes 120, a first source/drain contact 170, a second source/drain contact 270, a gate contact 180, and a wiring structure 205.

The substrate 100 may include a first active region RX1, a second active region RX2, and a field region FX. The field region FX may be formed directly adjacent to the first active region RX1 and the second active region RX2. The field region FX may form a boundary between the first active region RX1 and the second active region RX2.

The first active region RX1 and the second active region RX2 are spaced apart from each other. The first active region RX1 and the second active region RX2 may be separated by the field region FX.

Explaining in another way, an element separation film may be placed around the first active region RX1 and the second active region RX2 such that these elements are spaced apart from each other. At this time, a portion of the element separation film between the first active region RX1 and the second active region RX2 may be the field region FX. For example, a portion in which a channel region of a transistor which may be a semiconductor device is formed. This portion in which the channel region is formed may be the active region, and a portion that divides the channel region of the transistor formed in the active region may be the field region. In some embodiments, the active region is the portion in which a fin-type pattern or nanosheet used as the channel region of the transistor is formed, and the field region may be a region in which the fin-type pattern or nanosheet used as the channel region is not formed.

As shown in FIGS. 4A to 5B, the field region FX may be defined by, but is not limited to, a deep trench DT. In addition, it is obvious that an ordinary engineer in the technical field to which the present invention belongs may distinguish which part is the field region and which part is the active region.

As an example, one of the first active region RX1 and the second active region RX2 may be a PMOS forming region, and the other thereof may be an NMOS forming region. As another example, the first active region RX1 and the second active region RX2 may be the PMOS forming region. As still another example, the first active region RX1 and the second active region RX2 may be the NMOS forming region.

The substrate 100 may be a silicon substrate or an SOI (silicon-on-insulator). In contrast, the substrate 100 may include, but is not limited to, silicon germanium, SGOI (silicon germanium on insulator), indium antimonide, lead tellurium compounds, indium arsenic, indium phosphide, gallium arsenide and/or gallium antimonide.

At least one or more first active patterns AP1 may be formed in the first active region RX1. The first active pattern AP1 may protrude from the substrate 100 of the first active region RX1. The first active pattern AP1 may extend long along a first direction X on the substrate 100. For example, the first active pattern AP1 may include a long side extending in the first direction X, and a short side extending in the second direction Y. Here, the first direction X may intersect the second direction Y and the third direction Z. Also, the second direction Y may intersect the third direction Z.

At least one or more second active patterns AP2 may be formed in the second active region RX2. The description of the second active pattern AP2 may be substantially the same as the description of the first active pattern AP1.

Each of the first active pattern AP1 and the second active pattern AP2 may be a multi-channel active pattern. In the semiconductor device according to some embodiments, each of the first active pattern AP1 and the second active pattern AP2 may be, for example, a fin-type pattern. Each of the first active pattern AP1 and the second active pattern AP2 may be used as a channel pattern of the transistor. Although each of the number of the first active patterns AP1 and the second active patterns AP2 is shown as three, this is for convenience of explanation, and the number thereof is not limited thereto. The number of first active patterns AP1 and the second active patterns AP2 may each be one or more.

Each of the first active pattern AP1 and the second active pattern AP2 may be a part of the substrate 100, and may include an epitaxial layer that is grown from the substrate 100. The first active pattern AP1 and the second active pattern AP2 may include, for example, silicon or germanium, which is an elemental semiconductor material. Further, the first active pattern AP1 and the second active pattern AP2 may include a compound semiconductor, and may include, for example, a group IV-IV compound semiconductor or a group III-V compound semiconductor.

The group IV-IV compound semiconductor may be, for example, a binary compound or a ternary compound including at least two or more of carbon (C), silicon (Si), germanium (Ge), and tin (Sn), or a compound obtained by doping these elements with a group IV element.

The group III-V compound semiconductor may be, for example, one of a binary compound, a ternary compound, or a quaternary compound formed by combining at least one of aluminum (Al), gallium (Ga) and/or indium (In) as a group III element, and at least one of phosphorus (P), arsenic (As) and/or antimony (Sb) as a group V element.

As an example, the first active pattern AP1 and the second active pattern AP2 may include the same material. As another example, the first active pattern AP1 and the second active pattern AP2 may include materials different from each other.

A field insulating film 105 may be formed on the substrate 100. The field insulating film 105 may be formed over a first active region RX1, a second active region RX2, and a field region FX. The field insulating film 105 may fill a deep trench DT.

The field insulating film 105 may be formed on a part of the side wall of the first active pattern AP1 and a part of the side wall of the second active pattern AP2. The first active pattern AP1 and the second active pattern AP2 may each protrude upward from the upper face of the field insulating film 105. The field insulating film 105 may include, for example, an oxide film, a nitride film, an oxynitride film or a combination film thereof.

At least one or more gate structures GS may be placed on the substrate 100. For example, at least one or more gate structures GS may be placed on the field insulating film 105. The gate structure GS may extend in a second direction Y. Adjacent gate structures GS may be spaced apart from each other in the first direction X.

The gate structure GS may be on the first active pattern AP1 and/or the second active pattern AP2. The gate structure GS may intersect the first active pattern AP1 and/or the second active pattern AP2.

Although the gate structure GS is shown as being placed over the first active region RX1 and the second active region RX2, this is for convenience of explanation, and the embodiments are not limited thereto. That is, a part of the gate structure GS is separated into two parts by a gate separation structure placed on the field insulating film 105, and may be placed on the first active region RX1 and the second active region RX2.

The gate structure GS may include, for example, a gate electrode 120, a gate insulating film 130, a gate spacer 140 and a gate capping pattern 145.

The gate electrode 120 may be formed on the first active pattern AP1 and the second active pattern AP2. The gate electrode 120 may intersect the first active pattern AP1 and the second active pattern AP2. The gate electrode 120 may wrap the first active pattern AP1 and the second active pattern AP2 protruding from the upper face of the field insulating film 105. The gate electrode 120 may include a long side extending in the second direction Y, and a short side extending in the first direction X.

An upper face 120US of the gate electrode may be, but is not limited to, a concave curved face recessed toward the upper face of the first active pattern AP1. That is, unlike the shown case, the upper face 120US of the gate electrode may also be a flat face.

The gate electrode 120 may include, for example, at least one of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), and/or combinations thereof.

The gate electrode 120 may each include a conductive metal oxide, a conductive metal oxynitride, and the like, and may also include a form in which the above-mentioned materials are oxidized.

The gate spacer 140 may be placed on the side wall of the gate electrode 120. The gate spacer 140 may extend in the second direction Y. The gate spacer 140 may include, for example, at least one of silicon nitride (SiN), silicon oxynitride (SiON), silicon oxide (SiO$_2$), silicon oxycarbonitride (SiOCN), silicon boronitride (SiBN), silicon oxyboronitride (SiOBN), silicon oxycarbide (SiOC) and/or combinations thereof.

The gate insulating film 130 may extend along the side walls and bottom face of the gate electrode 120. The gate insulating film 130 may be formed on the first active pattern AP1, the second active pattern AP2 and the field insulating film 105. The gate insulating film 130 may be formed between the gate electrode 120 and the gate spacer 140.

The gate insulating film 130 may be formed along the profile of the first active pattern AP1 protruding upward from the field insulating film 105, and the upper face of the field insulating film 105. Although not shown, an interface film may be further formed along the profile of the first active pattern AP1 protruding upward from the field insulating film 105. Each gate insulating film 130 may be formed on the interface film. Although not shown, the gate insulating film 130 may be formed along the profile of the second active pattern AP2 protruding upward from the field insulating film 105.

The gate insulating film 130 may include silicon oxide, silicon oxynitride, silicon nitride, and/or a high dielectric constant material having a higher dielectric constant than silicon oxide. The high dielectric constant material may include, for example, one of more of boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide and/or lead zinc niobate.

The semiconductor device according to some embodiments may include an NC (Negative Capacitance) FET that uses a negative capacitor. For example, the gate insulating film 130 may include a ferroelectric material film having ferroelectric properties and a paraelectric material film having paraelectric properties.

The ferroelectric material film may have a negative capacitance, and the paraelectric material film may have a positive capacitance. For example, if two or more capacitors are connected in series and the capacitance of each capacitor has a positive value, the overall capacitances decrease from the capacitance of each individual capacitor. On the other hand, if at least one of the capacitances of the serially connected capacitors has a negative value, the overall capacitance may be greater than an absolute value of each of the individual capacitances, while having a positive value.

When the ferroelectric material film having the negative capacitance and the paraelectric material film having the positive capacitance are connected in series, the overall capacitance value of the ferroelectric material film and the paraelectric material film connected in series may increase. Taking advantage of the increased overall capacitance value, a transistor including the ferroelectric material film may have a subthreshold swing (SS) of less than 60 mV/decade at room temperature.

The ferroelectric material film may have ferroelectric properties. The ferroelectric material film may include at least one of hafnium oxide, hafnium zirconium oxide, barium strontium titanium oxide, barium titanium oxide, and/or lead zirconium titanium oxide. Here, as an example, the hafnium zirconium oxide may be a material obtained by doping hafnium oxide with zirconium (Zr). As another example, the hafnium zirconium oxide may be a compound of hafnium (Hf), zirconium (Zr) and oxygen (O).

The ferroelectric material film may further include a doped dopant. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr) and/or tin (Sn). The type of dopant in the ferroelectric material film may differ, depending on which ferroelectric material is included in the ferroelectric material film.

When the ferroelectric material film includes hafnium oxide, the dopant in the ferroelectric material film may include, for example, at least one of gadolinium (Gd), silicon (Si), zirconium (Zr), aluminum (Al) and/or yttrium (Y).

When the dopant is aluminum (Al), the ferroelectric material film may include 3 to 8 at % (atomic %) aluminum. Here, a ratio of the dopant may be a ratio of aluminum to the sum of hafnium and aluminum.

When the dopant is silicon (Si), the ferroelectric material film may include 2 to 10 at % silicon. When the dopant is yttrium (Y), the ferroelectric material film may include 2 to 10 at % yttrium. When the dopant is gadolinium (Gd), the ferroelectric material film may include 1 to 7 at % gadolinium. When the dopant is zirconium (Zr), the ferroelectric material film may include 50 to 80 at % zirconium.

The paraelectric material film may have the paraelectric properties. The paraelectric material film may include at least one of, for example, a silicon oxide and a metal oxide having a high dielectric constant. The metal oxide in the paraelectric material film may include, for example, but is not limited to, at least one of hafnium oxide, zirconium oxide and/or aluminum oxide.

The ferroelectric material film and the paraelectric material film may include the same material. The ferroelectric material film has ferroelectric properties, but the paraelectric material film may not have ferroelectric properties. For example, when the ferroelectric material film and the paraelectric material film include hafnium oxide, a crystal structure of the hafnium oxide in the ferroelectric material film is different from a crystal structure of the hafnium oxide contained in the paraelectric material film.

The ferroelectric material film may have a thickness having ferroelectric properties. The thickness of the ferroelectric material film may be, for example, but is not limited to, 0.5 to 10 nm. Since each ferroelectric material may have a different critical thickness that exhibits the ferroelectric properties, the thickness of the ferroelectric material film may vary depending on the ferroelectric material.

As an example, the gate insulating film 130 may include one ferroelectric material film. As another example, the gate insulating film 130 may include a plurality of ferroelectric material films spaced apart from each other. The gate insulating film 130 may have a stacked film structure in which the plurality of ferroelectric material films and the plurality of paraelectric material films are alternately stacked.

The gate capping pattern 145 may be on the upper face 120US of the gate electrode and the upper face of the gate spacer 140. The gate capping pattern 145 may include, for example, at least one of silicon nitride (SiN), silicon oxynitride (SiON), silicon oxide (SiO$_2$), silicon carbonitride (SiCN), silicon oxycarbonitride (SiOCN) and/or a combination thereof.

Unlike the shown case, the gate capping pattern 145 may be placed between the gate spacers 140. In such a case, the upper face 145US of the gate capping pattern may be placed on the same plane as the upper face of the gate spacer 140. The upper face 145US of the gate capping pattern may be the upper face of the gate structure GS.

A source/drain pattern 150 may be formed on the first active pattern AP1. The source/drain pattern 150 may be on the substrate 100. The source/drain pattern 150 may be on the side face of the gate structure GS. The source/drain pattern 150 may be between the gate structures GS.

For example, the source/drain pattern 150 may be on both sides of the gate structure GS. Unlike the shown case, the source/drain pattern 150 is on one side of the gate structure GS, but may not be on the other side of the gate structure GS.

The source/drain pattern 150 may include an epitaxial pattern. The source/drain pattern 150 may be included in a source/drain of a transistor that uses the first active pattern AP1 as a channel region.

The source/drain pattern 150 may be connected to a channel pattern portion used as the channel in the first active pattern AP1. Although the source/drain pattern 150 is shown to be merged by two epitaxial patterns formed on each first active pattern AP1, this is for convenience of explanation, and the embodiments are not limited thereto. That is, the epitaxial patterns formed on each of the first active patterns AP1 may be separated from each other.

As an example, an air gap may be placed in the space between the source/drain patterns 150 merged with the field insulating film 105. As another example, the space between the source/drain patterns 150 merged with the field insulating film 105 may be filled with an insulating material.

Although not shown, a source/drain pattern as described above may be placed on the second active pattern AP2 between the gate structures GS.

In FIGS. 2B and 5B, a first etching stop film 156 may be placed on the upper face of the field insulating film 105, the side wall of the gate structure GS, the upper face of the source/drain pattern 150, and the side wall of the source/drain pattern 150. The first etching stop film 156 may include a material having an etching selectivity with respect to a first interlayer insulating film 190 that is above the etching stop film 156. The first etching stop film 156 may include, for example, at least one of silicon nitride (SiN), silicon oxynitride (SiON), silicon oxycarbonitride (SiOCN), silicon boronitride (SiBN), silicon oxyboronitride (SiOBN), silicon oxycarbide (SiOC) and/or combinations thereof. The following description will be provided using FIGS. 2A and 5A in which the first etching stop film 156 is not shown.

The first interlayer insulating film 190 may be formed on the field insulating film 105. The first interlayer insulating film 190 may be placed on the source/drain pattern 150. The first interlayer insulating film 190 may not cover or overlap the upper face 145US of the gate capping pattern. For example, the upper face of the first interlayer insulating film 190 may be on the same plane as the upper face 145US of the gate structure.

The first interlayer insulating film 190 may include, for example at least one of silicon oxide, silicon nitride, silicon oxynitride and/or a low dielectric constant material. The low dielectric constant material may include for example, but is not limited to, Fluorinated TetraEthylOrthoSilicate (FTEOS), Hydrogen SilsesQuioxane (HSQ), Bi s-benzoCycloButene (BCB), TetraMethylOrthoSilicate (TMOS), OctaMethyleyCloTetraSiloxane (OMCTS), HexaMethylDiSiloxane (HMDS), TriMethylSilyl Borate (TMSB), DiAcetoxyDitertiaryButoSiloxane (DADBS), TriMethylSilil Phosphate (TMSP), PolyTetraFluoroEthylene (PTFE), TOSZ (Tonen SilaZen), FSG (Fluoride Silicate Glass), polyimide nanofoams such as polypropylene oxide, CDO (Carbon Doped silicon Oxide), OSG (Organo Silicate Glass), SiLK, Amorphous Fluorinated Carbon, silica aerogels, silica xerogels, mesoporous silica or combinations thereof.

The first source/drain contact 170 may be on the first active region RX1. The second source/drain contact 270 may be placed on the second active region RX2. The first source/drain contact 170 may be connected to the source/drain pattern 150 formed in the first active region RX1. Although not shown, the second source/drain contact 270 may be connected to a source/drain pattern formed in the second active region RX2.

Unlike the shown case, a part of the first source/drain contact 170 may be directly connected to a part of the second source/drain contact 270. That is, in the semiconductor device according to some embodiments, at least one or more source/drain contacts may be placed over the first active region RX1 and the second active region RX2.

Since the matters of the second source/drain contact 270 are substantially the same as those of the first source/drain contact 170, the following description will be provided using the first source/drain contact 170 on the first active pattern AP1.

The gate contact 180 may be inside the gate structure GS, and may be connected to the gate electrode 120 included in the gate structure GS.

The gate contact 180 may be at a position where it overlaps the gate structure GS. In the semiconductor device according to some embodiments, at least a part of the gate contact 180 may be at a position where it overlaps at least one of the first active region RX1 and the second active region RX2.

For example, the gate contact 180 may be entirely on the first active region RX1 and the second active region RX2.

The first source/drain contact 170 may be physically and/or electrically connected to the source/drain pattern 150. The first source/drain contact 170 may be on the source/drain pattern 150.

The first source/drain contact 170 may be in the first interlayer insulating film 190. The first source/drain contact 170 may be surrounded by the first interlayer insulating film 190 in a plan view (i.e., in the X and Y directions).

For example, the first source/drain contact 170 may not be in contact with at least one of the gate structures GS that are on both sides of the first source/drain contact 170.

A silicide film 155 may be formed between the first source/drain contact 170 and the source/drain pattern 150. Although the silicide film 155 is shown as being formed along the profile of the interface between the source/drain pattern 150 and the first source/drain contact 170, the embodiments are not limited thereto. The silicide film 155 may include, for example, a metal silicide material.

The first source/drain contact 170 may include a first portion and a second portion. The first portion of the first source/drain contact 170 may be directly connected to the second portion of the first source/drain contact 170.

The second portion of the first source/drain contact 170 is a portion on which the wiring structure 205 is landed. The first source/drain contact 170 may be connected to the wiring structure 205 through the second portion of the first source/drain contact 170. The first portion of the first source/drain contact 170 is not a portion on which the wiring structure 205 is landed.

For example, in the cross-sectional views such as FIGS. 2A and 2B, the second portion of the first source/drain contact 170 may be located in the portion connected to the wiring structure 205. The first portion of the first source/drain contact 170 may be located in a portion that is not connected to the wiring structure 205.

Also, in order to prevent the gate contact 180 and the first source/drain contact 170 from coming into contact with each other, on both sides of the gate structure GS of the portion connected to the gate contact 180, the first portion 170_1 of the first source/drain contact 170 is located and the second portion 170_2 of the first source/drain contact 170 is not located. In other words, the first portion 170_1, which is a portion of the first source/drain contact 170 adjacent to the second portion 170_2 in the second direction Y, is spaced apart from the sides of the gate structure GS in the first direction X, thereby preventing contact between the gate contact 180 and the first source/drain contact 170. That is, in the cross-sectional views such as those in FIGS. 2A, 2B, 5A and 5B, the first portion 170_1 of the first source/drain contact 170 is on both sides of the gate structure GS connected to the gate contact 180, and the second portion 170_2 of the first source/drain contact 170 is not on the sides of the gate structure GS.

The upper face of the second portion of the first source/drain contact 170 is higher than the upper face of the first portion of the first source/drain contact 170. In FIGS. 5A and 5B, the upper face of the second portion of the first source/drain contact 170 is higher than the upper face of the first portion of the first source/drain contact 170 on the basis of the upper face of the field insulating film 105. For example, the upper face 170 US of the first source/drain contact may be the upper face of the second portion of the first source/drain contact 170.

In FIGS. 5A and 5B, although the first source/drain contact 170 is shown to have an L-shape, the embodiments are not limited thereto. Unlike the shown case, the first source/drain contact 170 may also have a T-shape that is rotated by 180 degrees. In such a case, the first portion of the first source/drain contact 170 may be placed on both sides of the second portion of the first source/drain contact 170.

The first interlayer insulating film 190 does not cover or overlap the upper face 170 US of the first source/drain contact. For example, the first interlayer insulating film 190 may not cover or overlap the upper face of the second portion of the first source/drain contact 170.

As an example, the upper face 170 US of the first source/drain contact may not protrude upward from the upper face 145US of the gate structure. The upper face 170 US of the second portion of the first source/drain contact 170 may be on the same plane as the upper face 145US of the gate structure. As another example, unlike the shown case, the upper face 170 US of the first source/drain contact may not protrude upward from the upper face of the gate structure 145US.

For example, a height H12 from the upper face of the first active pattern AP1 to the upper face 120US of the gate electrode may be greater than a height H11 from the upper face of the first active pattern AP1 to the upper face of the first portion of the first source/drain contacts 170. If the upper face of the gate electrode 120US has a concave shape in the cross-sectional view, the height of the upper face 120US of the gate electrode may be a portion that is closest to the upper face of the first active pattern AP1.

The first source/drain contact 170 may include a first source/drain barrier film 170a, and a first source/drain filling film 170b on the first source/drain barrier film 170a. The first source/drain barrier film 170a may extend along the side walls and bottom face of the first source/drain filling film 170b.

Although a bottom face 170_BS of the first source/drain contact is shown to have a wavy shape, the embodiment is not limited thereto. Unlike the shown case, the bottom face 170_BS of the first source/drain contact may, of course, have a flat shape.

The first source/drain barrier film 170a may include, for example, at least one of tantalum (Ta), tantalum nitride (TaN), titanium (Ti), titanium nitride (TiN), titanium silicon nitride (TiSiN), ruthenium (Ru), cobalt (Co), nickel (Ni), nickel boron (NiB), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Ir), rhodium (Rh), and/or two-dimensional (2D) material. In the semiconductor device according to some embodiments, the two-dimensional material may be a metallic material and/or a semiconductor material. The two-dimensional material may include two-dimensional allotrope or two-dimensional compound, and may include, for example, but is not limited to, at least one of graphene, molybdenum disulfide ($MoS_2$), molybdenum diselenide ($MoSe_2$), tungsten diselenide ($WSe_2$), and/or tungsten disulfide ($WS_2$). That is, since the above-mentioned two-dimensional materials are only listed by way of example, the two-dimensional materials that may be included in the semiconductor device of the present invention are not limited by the above-mentioned materials.

The first source/drain filling film 170b may include, for example, at least one of aluminum (Al), tungsten (W), cobalt (Co), ruthenium (Ru), silver (Ag), gold (Au), manganese (Mn) and/or molybdenum (Mo).

The gate contact 180 may be on the gate electrode 120, and may penetrate the gate capping pattern 145 and be connected to the gate electrode 120.

As an example, the upper face 180 US of the gate contact may be placed on the same plane as the upper face 145US of the gate structure. As another example, unlike the shown case, the upper face 180 US of the gate contact may protrude upward from the upper face 145US of the gate structure.

The gate contact 180 may include a gate barrier film 180a, and a gate filling film 180b on the gate barrier film 180a. The contents of the materials contained in the gate barrier film 180a and the gate filling film 180b may be the same as the explanation of the first source/drain barrier film 170a and the first source/drain filling film 170b.

The second interlayer insulating film 191 may be placed on the first interlayer insulating film 190. The second interlayer insulating film 191 may include a first via hole 206t and a second via hole 207t. The first via hole 206t may expose the first source/drain contact 170. The second via hole 207t may expose the gate contact 180.

The third interlayer insulating film 192 may be on the second interlayer insulating film 191.

The second interlayer insulating film 191 and the third interlayer insulating film 192 may each include, for example, at least one of silicon oxide, silicon nitride, silicon oxynitride and/or a low dielectric constant material.

In FIGS. 2B, 4B and 5B, the second etching stop film 196 may be between the first interlayer insulating film 190 and the second interlayer insulating film 191. The second etching stop film 196 may include a material having an etching selectivity with respect to the second interlayer insulating film 191. The second etching stop film 196 may include, for example, at least one of silicon nitride (SiN), silicon oxynitride (SiON), silicon oxycarbonitride (SiOCN), silicon boronitride (SiBN), silicon oxyboronitride (SiOBN), silicon oxycarbide (SiOC), aluminum oxide (AlO), aluminum nitride (AlN), aluminum oxycarbide (AlOC) and/or combinations thereof. The following description will be provided using FIGS. 2A, 4A and 5A in which the second etching stop film 196 is not shown.

The wiring structure 205 may be placed on the first source/drain contact 170, the second source/drain contact 270, and the gate contact 180. The wiring structure 205 may be connected to the first source/drain contact 170, the second source/drain contact 270 and the gate contact 180.

The wiring structure 205 may include a first via plug 206, a second via plug 207, and a wiring line 208. The first via plug 206 may be connected to the first source/drain contact 170. The second via plug 207 may be connected to the gate contact 180. Each of the first via plug 206 and the second via plug 207 may be connected to the wiring line 208.

The wiring structure 205 may be in the second interlayer insulating film 191 and the third interlayer insulating film 192. The first via plug 206 and the second via plug 207 may be in the second interlayer insulating film 191. The wiring line 208 may be in the third interlayer insulating film 192. The wiring line 208 may be on the upper face 191US of the second interlayer insulating film.

The first via plug 206 may fill the first via hole 206t in the second interlayer insulating film 191. The first via plug 206 may have a single film structure. That is, the first via plug 206 may have a single conductive film structure.

As an example, the first via plug 206 may be formed of a single grain. The first via plug 206 may not include a plurality of grains separated by a grain boundary.

As another example, the first via plug 206 may include a lower part and an upper part. The lower part of the first via plug 206 may be formed of a single grain, and the upper part of the first via plug 206 may be formed of a plurality of grains. Since the lower part of the first via plug 206 and the upper part of the first via plug 206 are made of the same material, the first via plug 206 may have a single conductive film structure.

The first via plug 206 may include, for example, tungsten (W).

In the semiconductor device according to some embodiments, a part of the first via plug 206 may protrude in the third direction Z from the upper face 191US of the second interlayer insulating film. For example, the upper face 206 US of the first via plug may have a convex curved face. The upper face 206 US of the first via plug may protrude toward the wiring line 208.

The second via plug 207 may fill the second via hole 207t in the second interlayer insulating film 191. The second via plug 207 may have a multi-film structure. That is, the second via plug 207 may have a multi-conductive film structure.

The second via plug 207 may include a via barrier film 207a and a via filling film 207b. The via filling film 207b may include a lower via filling film 207LP, and an upper via filling film 207UP on the lower via filling film 207LP. The via filling film 207b, lower via filling film 207LP, upper via filling film 207UP, and/or other filling films described herein may at least partially occupy or fill the corresponding structure.

The via barrier film 207a may extend along a part of the side wall of the second via hole 207t and the bottom face of the second via hole 207t. In some embodiments, the via barrier film 207a may extend along the side wall 207LP SW of the lower via filling film and the bottom face 207LP BS of the lower via filling film.

The lower via filling film 207LP and the via barrier film 207a may fill a part of the second via hole 207t.

In the semiconductor device according to some embodiments, a height H21 from the bottom face 207LP BS of the lower via filling film to the upper face 207LP US of the lower via filling film may be the same as a height H22 from the bottom face 207LP BS of the lower via filling film to the upper face 207a US of the via barrier film.

The upper via filling film 207UP may be on the lower via filling film 207LP and the via barrier film 207a. The upper via filling film 207UP may fill the rest of the second via hole 207t.

The upper via filling film 207UP may cover or overlap the upper face 207LP US of the lower via filling film and the upper face 207a US of the via barrier film.

In the semiconductor device according to some embodiments, a part of the second via plug 206 may protrude in the third direction Z from the upper face 191US of the second interlayer insulating film. For example, a part of the upper via filling film 207UP may protrude in the third direction Z from the upper face 191US of the second interlayer insulating film.

The upper face 207_US of the second via plug may be defined by the upper via filling film 207UP. For example, the upper face 207_US of the second via plug may have a convex curved face. The upper face 207_US of the second via plug may protrude toward the wiring line 208. As it goes away from a point on which the upper via filling film 207UP and the second interlayer insulating film 191 form a boundary, the upper face 207_US of the second via plug may rise and fall on the basis of the upper face 191US of the second interlayer insulating film.

The via barrier film 207a may include, for example, at least one of tantalum (Ta), tantalum nitride (TaN), titanium (Ti), titanium nitride (TiN), titanium silicon nitride (TiSiN), nickel (Ni), nickel boron (NiB), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Ir), rhodium (Rh), and/or two-dimensional (2D) material.

The lower via filling film 207LP may include, for example, at least one of aluminum (Al), tungsten (W), cobalt (Co), ruthenium (Ru), copper (Cu), silver (Ag), gold (Au), manganese (Mn) and/or molybdenum (Mo).

The upper via filling film 207UP includes the same material as the first via plug 206. The upper via filling film 207UP may include, for example, tungsten (W). The upper via filling film 207UP may be formed at the same level as the first via plug 206. Here, the term "same level" means that they are formed by the same fabricating process.

As an example, the upper via filling film 207UP may be formed of a single grain. The first via plug 206 may not include a plurality of grains separated by the grain boundary. That is, when the first via plug 206 is formed of a single grain, the upper via filling film 207UP may also be formed of a single grain.

As another example, the upper via filling film 207UP may be formed of a plurality of grains.

As an example, the upper via filling film 207UP may include a material different from that of the lower via filling film 207LP. As another example, the upper via filling film 207UP may include the same material as the lower via filling film 207LP. That is, the upper via filling film 207UP and the lower via filling film 207LP may include tungsten (W). At this time, the upper via filling film 207UP may be formed of a single grain. The lower via filling film 207LP may be formed of a plurality of grains. Differences in crystallinity between the upper via filling film 207UP and the lower via filling film 207LP may be distinguished using an analyzer.

The wiring line 208 may be placed in the third interlayer insulating film 192. The wiring line 208 may be placed on the second interlayer insulating film 191.

The wiring line 208 may include a wiring barrier film 208a and a wiring filling film 208b. The wiring barrier film 208a may extend along the upper face 191US of the second interlayer insulating film, the upper face 206 US of the first via plug, and the upper face 207_US of the second via plug. The wiring filling film 208b may be on the wiring barrier film 208a.

The wiring barrier film 208a may include, for example, at least one of tantalum (Ta), tantalum nitride (TaN), titanium (Ti), titanium nitride (TiN), titanium silicon nitride (TiSiN), ruthenium (Ru), cobalt (Co), nickel (Ni), nickel boron (NiB), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Ir), rhodium (Rh), and two-dimensional (2D) material. The wiring filling film 208b may each include, for example, at least one of aluminum (Al), copper (Cu), tungsten (W), cobalt (Co), ruthenium (Ru), silver (Ag), gold (Au), manganese (Mn), and/or molybdenum (Mo).

Although not shown, a first connection contact which connects the first via plug 206 and the first source/drain contact 170 may be further between the first via plug 206 and the first source/drain contact 170. Further, a second connection contact which connects the second via plug 207 and the gate contact 180 may be further between the second via plug 207 and the gate contact 180.

Figure 6:
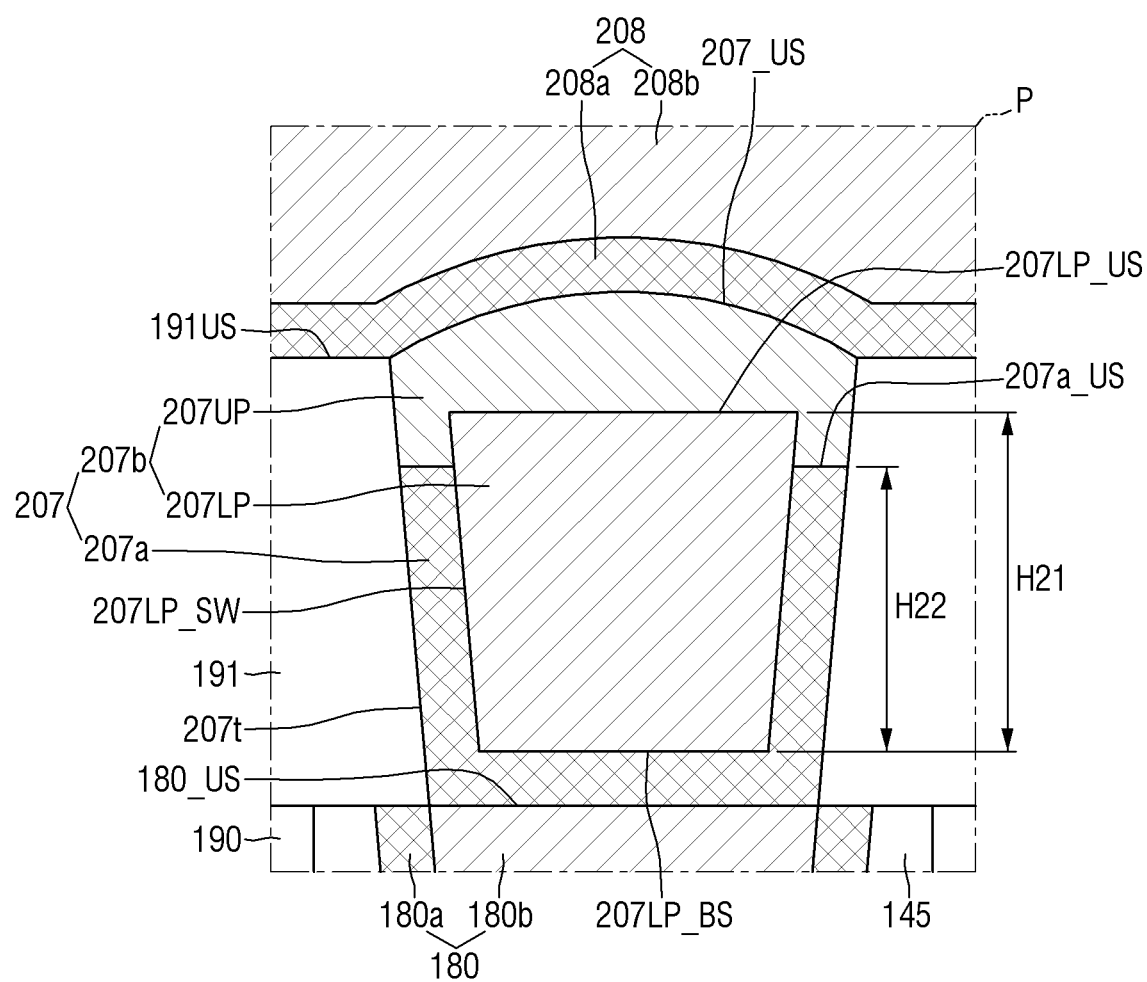
FIG. 6 is a diagram for explaining the semiconductor device according to some embodiments.
Figure 7:
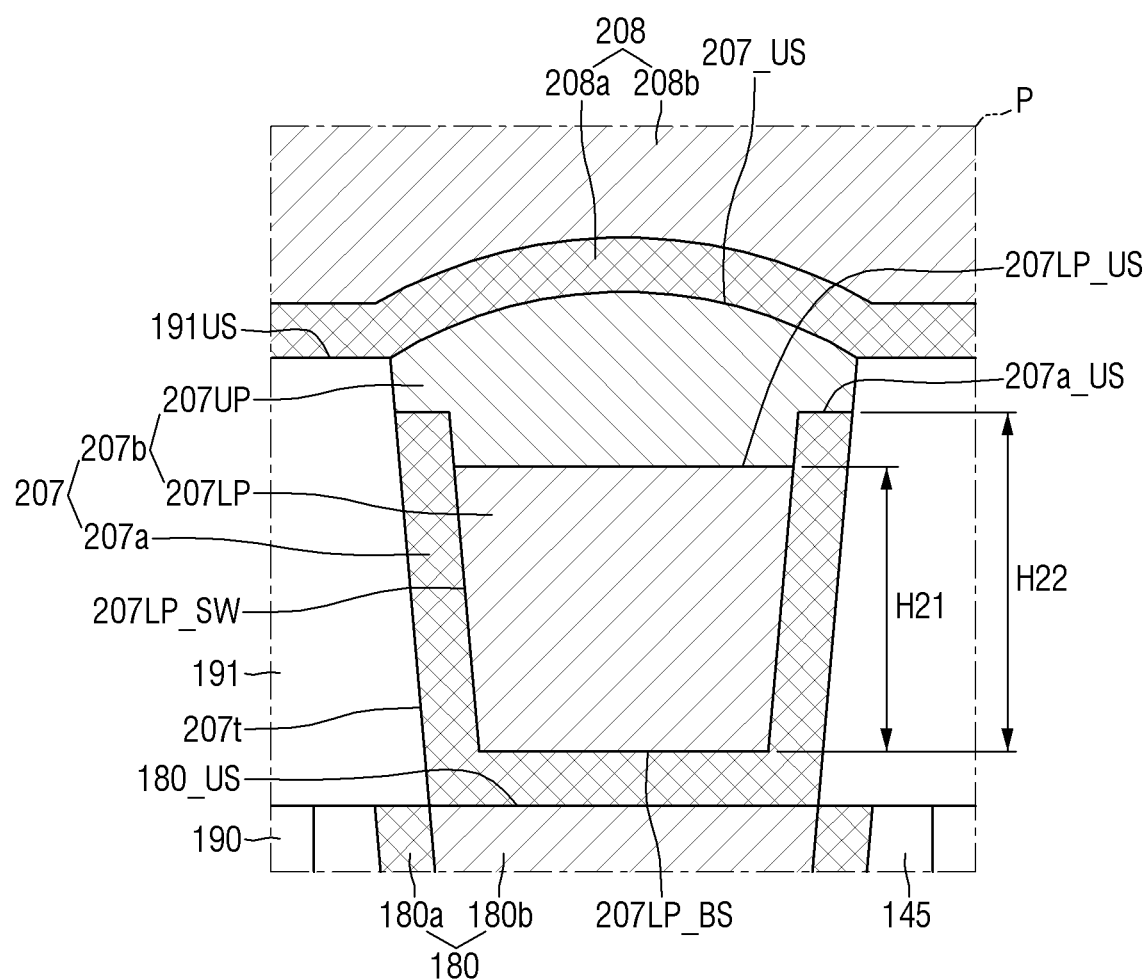
FIG. 7 is a diagram for explaining the semiconductor device according to some embodiments.

FIG. 6 is a diagram for explaining the semiconductor device according to some embodiments. FIG. 7 is a diagram for explaining the semiconductor device according to some embodiments. For convenience of explanation, the points different from the contents described using FIGS. 1 to 5B will be mainly described. For reference, FIGS. 6 and 7 may be enlarged views of a portion P of FIG. 2A.

Referring to FIGS. 6 and 7, in the semiconductor device according to some embodiments, the height H21 from the bottom face 207LP BS of the lower via filling film to the upper face 207LP US of the lower via filling film is different from the height H22 from the bottom face 207LP BS of the lower via filling film to the upper face 207a US of the via barrier film.

In FIG. 6, the height H21 from the bottom face 207LP BS of the lower via filling film to the upper face 207LP US of the lower via filling film is greater than the height H22 from the bottom face 207LP BS of the lower via filling film to the upper face 207a US of the via barrier film.

In FIG. 7, the height H21 from the bottom face 207LP BS of the lower via filling film to the upper face 207LP US of the lower via filling film is smaller than the height H22 from the bottom face 207LP BS of the lower via filling film to the upper face 207a US of the via barrier film.

Figure 8:
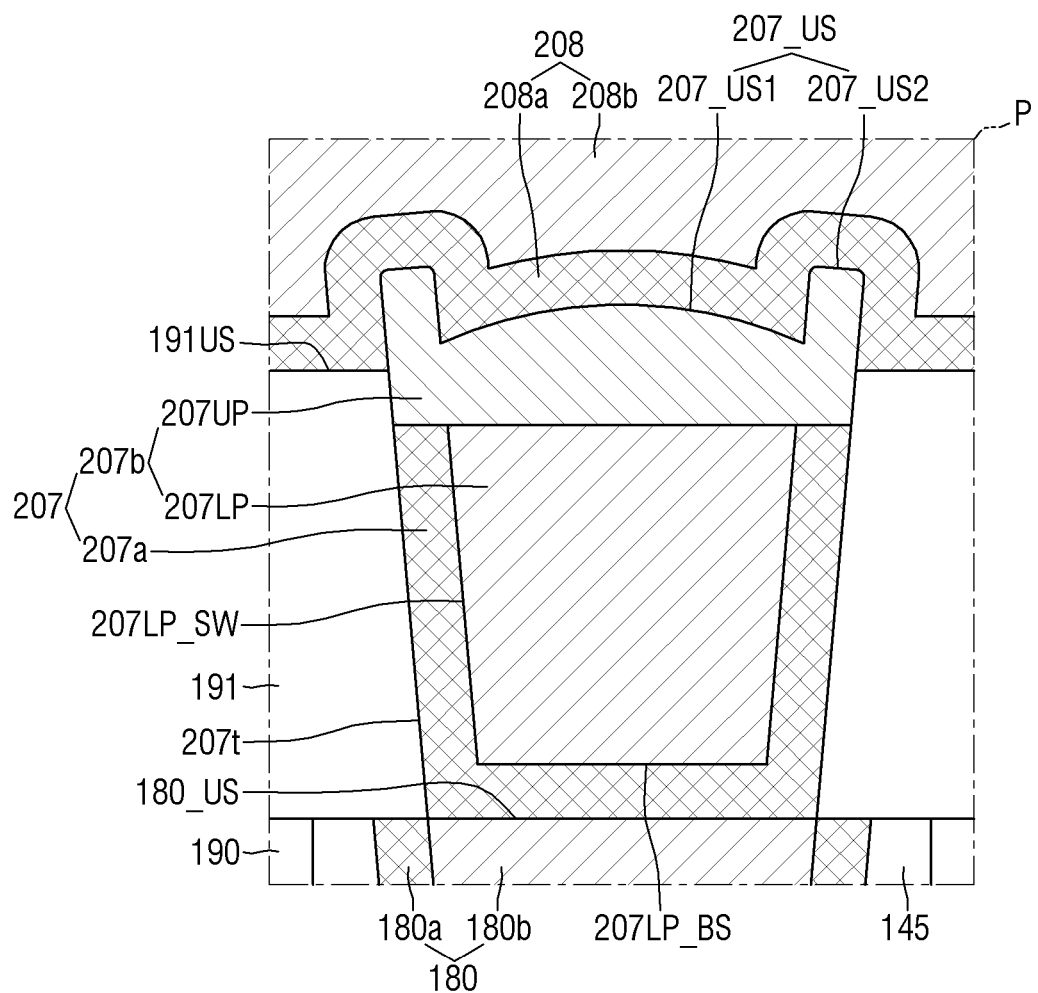
FIG. 8 is a diagram for explaining the semiconductor device according to some embodiments.
Figure 9:
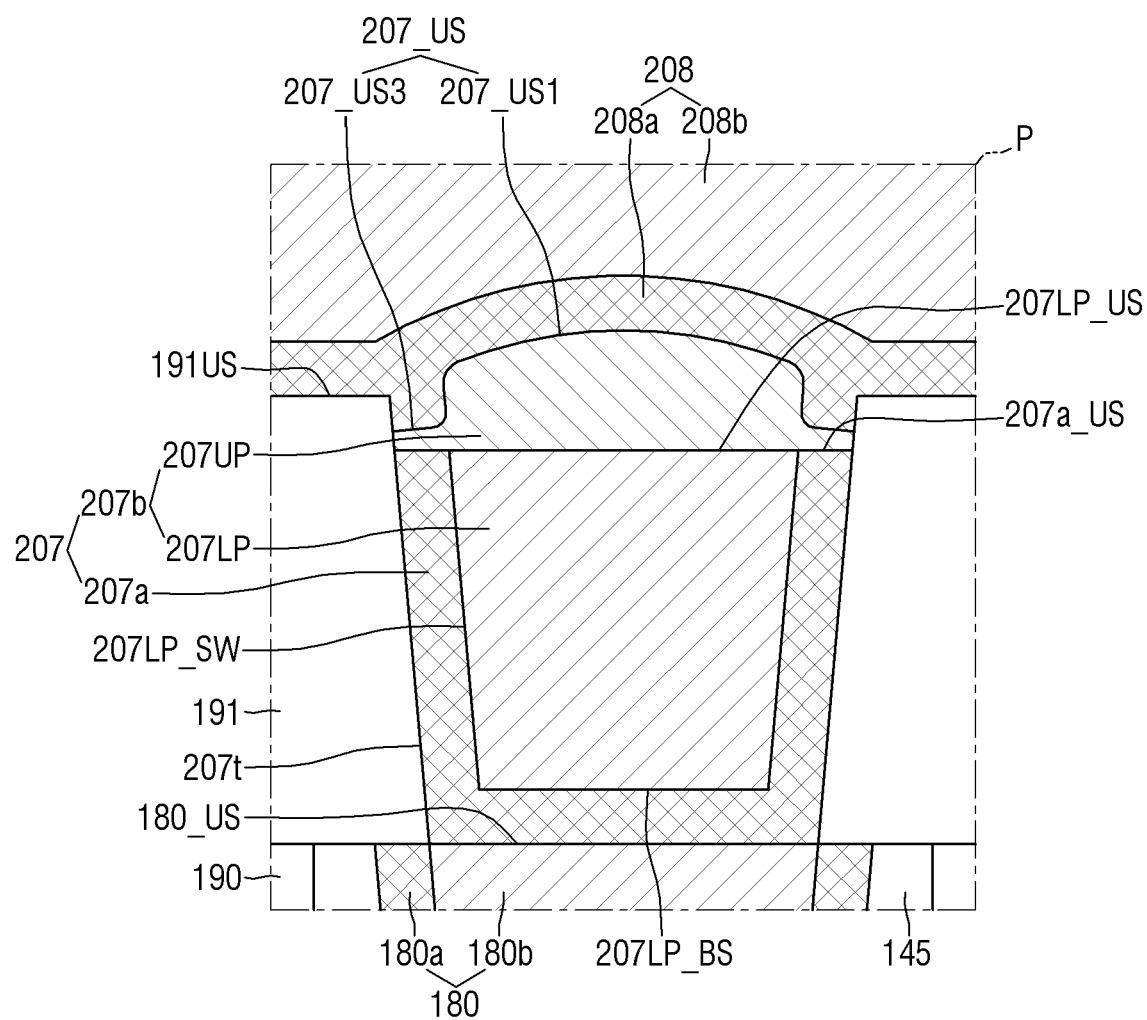
FIG. 9 is a diagram for explaining the semiconductor device according to some embodiments.

FIG. 8 is a diagram for explaining the semiconductor device according to some embodiments. FIG. 9 is a diagram for explaining the semiconductor device according to some embodiments. For convenience of explanation, the points different from the contents described using FIGS. 1 to 5B will be mainly described. For reference, FIGS. 8 and 9 may be enlarged views of the portion P of FIG. 2A.

Referring to FIG. 8, in the semiconductor device according to some embodiments, the upper face 207_US of the second via plug may include a first portion 207_US1 and a second portion 207_US2.

The second portion 207_US2 of the upper face of the second via plug may be on both sides of the first portion 207_US1 of the upper face of the second via plug. The second portion 207_US2 of the upper face of the second via plug may be placed near the boundary with the upper face 191US of the second interlayer insulating film.

On the basis of the upper face 191US of the second interlayer insulating film, the second portion 207_US2 of the upper face of the second via plug may be a portion protruding from the first portion 207_US1 of the upper face of the second via plug in the third direction Z. The first portion 207_US1 of the upper face of the second via plug and the second portion 207_US2 of the upper face of the second via plug may each have a convex curved face. The curvature of the first portion 207_US1 of the upper face of the second via plug is different from the curvature of the second portion 207_US2 of the upper face of the second via plug.

As it goes away from a point on which the upper via filling film 207UP and the second interlayer insulating film 191 form a boundary, the upper face 207_US of the second via plug may rise and fall, rise and fall again, and rise and fall again, on the basis of the upper face 191US of the second interlayer insulating film.

Referring to FIG. 9, in the semiconductor device according to some embodiments, the upper face 207_US of the second via plug may include a first portion 207_US1 and a third portion 207_US3.

The third portion 207_US3 of the upper face of the second via plug may be placed on both sides of the first portion 207_US1 of the upper face of the second via plug. The third portion 207_US3 of the upper face of the second via plug may be placed near the boundary with the upper face 191US of the second interlayer insulating film.

On the basis of the upper face 191US of the second interlayer insulating film, the third portion 207_US3 of the upper face of the second via plug may be a portion which enters in the third direction Z beyond the first portion 207_US1 of the upper face of the second via plug. For example, the third portion 207_US3 of the upper face of the second via plug may be lower than the upper face 191US of the second interlayer insulating film.

For example, a part of the wiring barrier film 208a may enter between the upper via filling film 207UP and the second interlayer insulating film 191.

Figure 10:
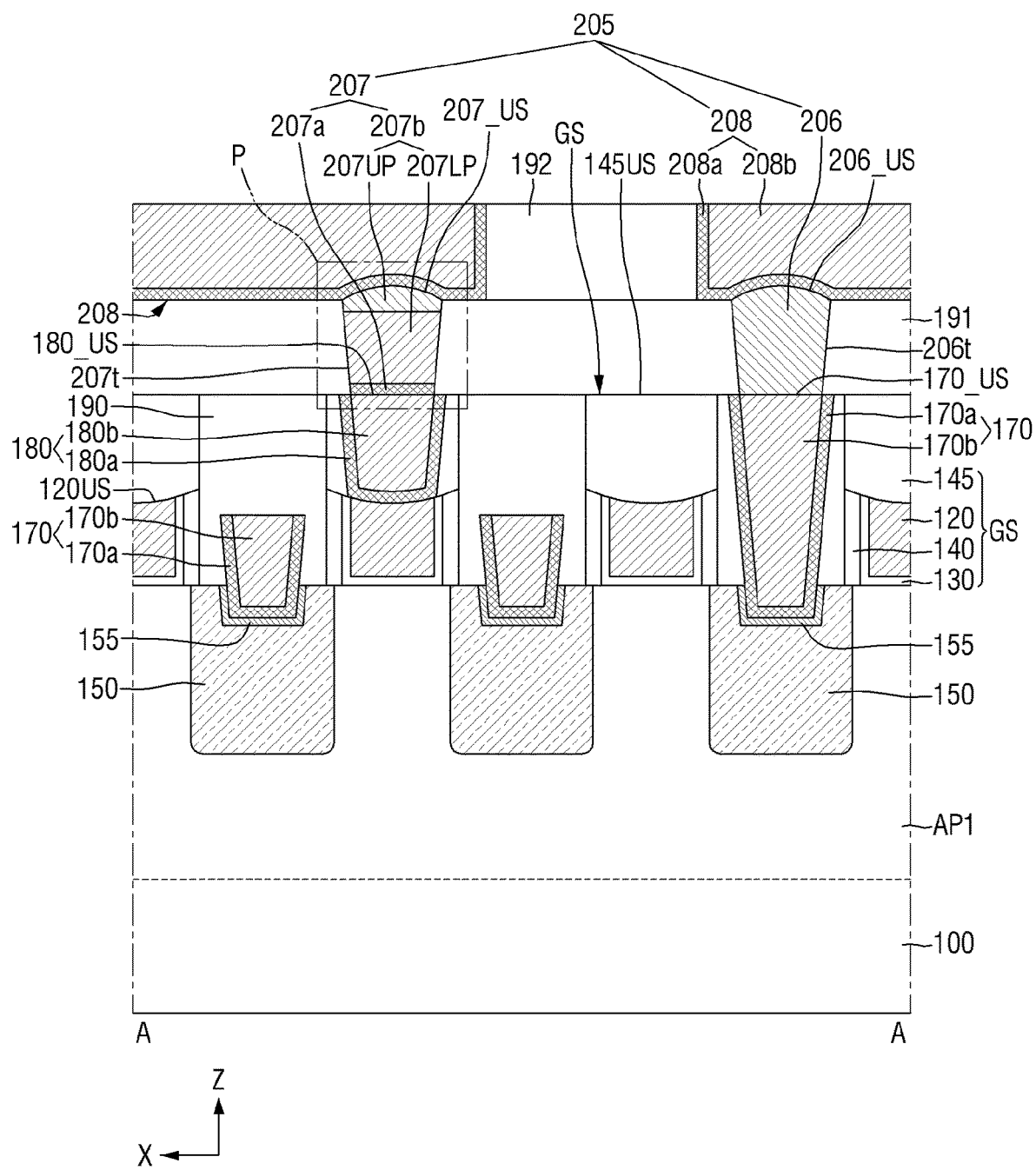
FIGS. 10 and 11 are diagrams for explaining the semiconductor device according to some embodiments.
Figure 11:
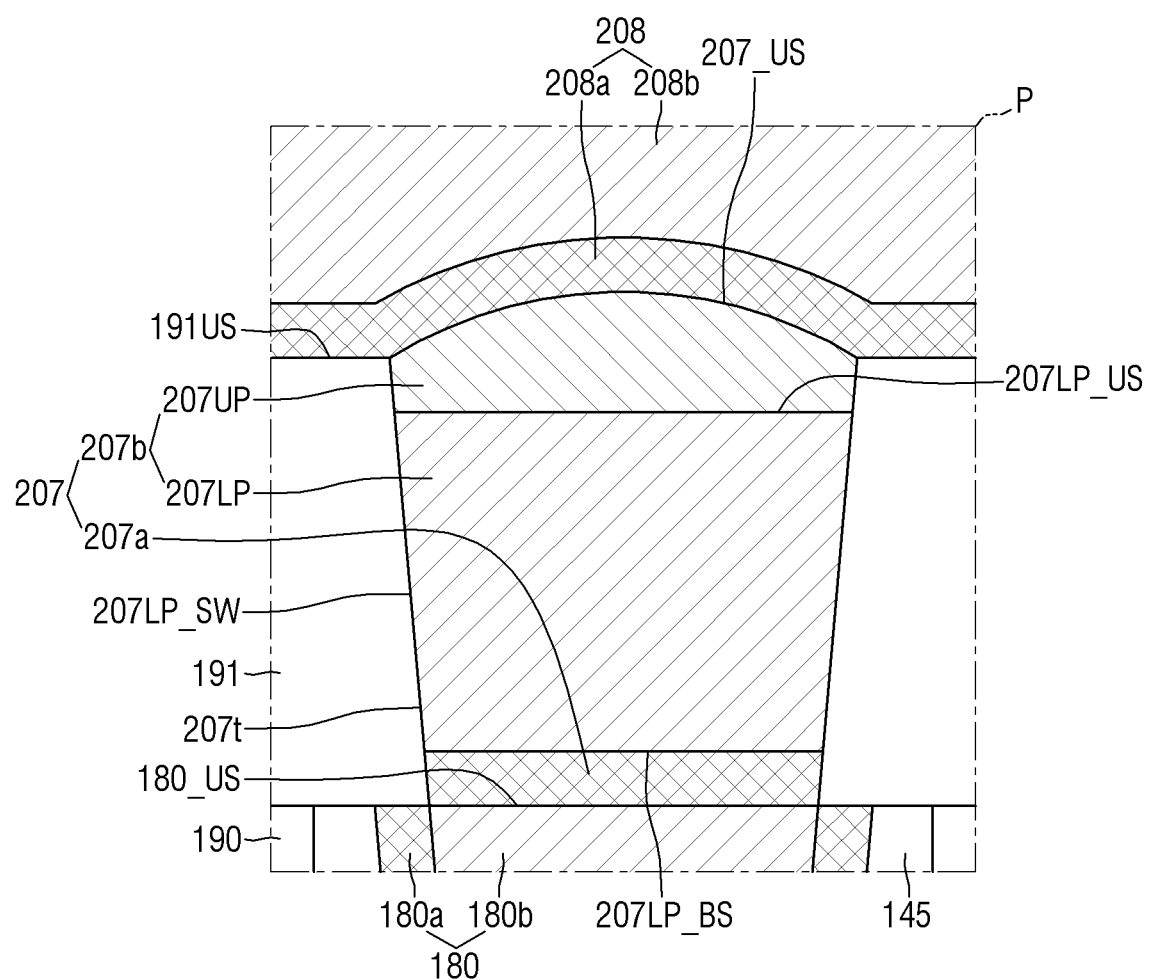
Figure 12:
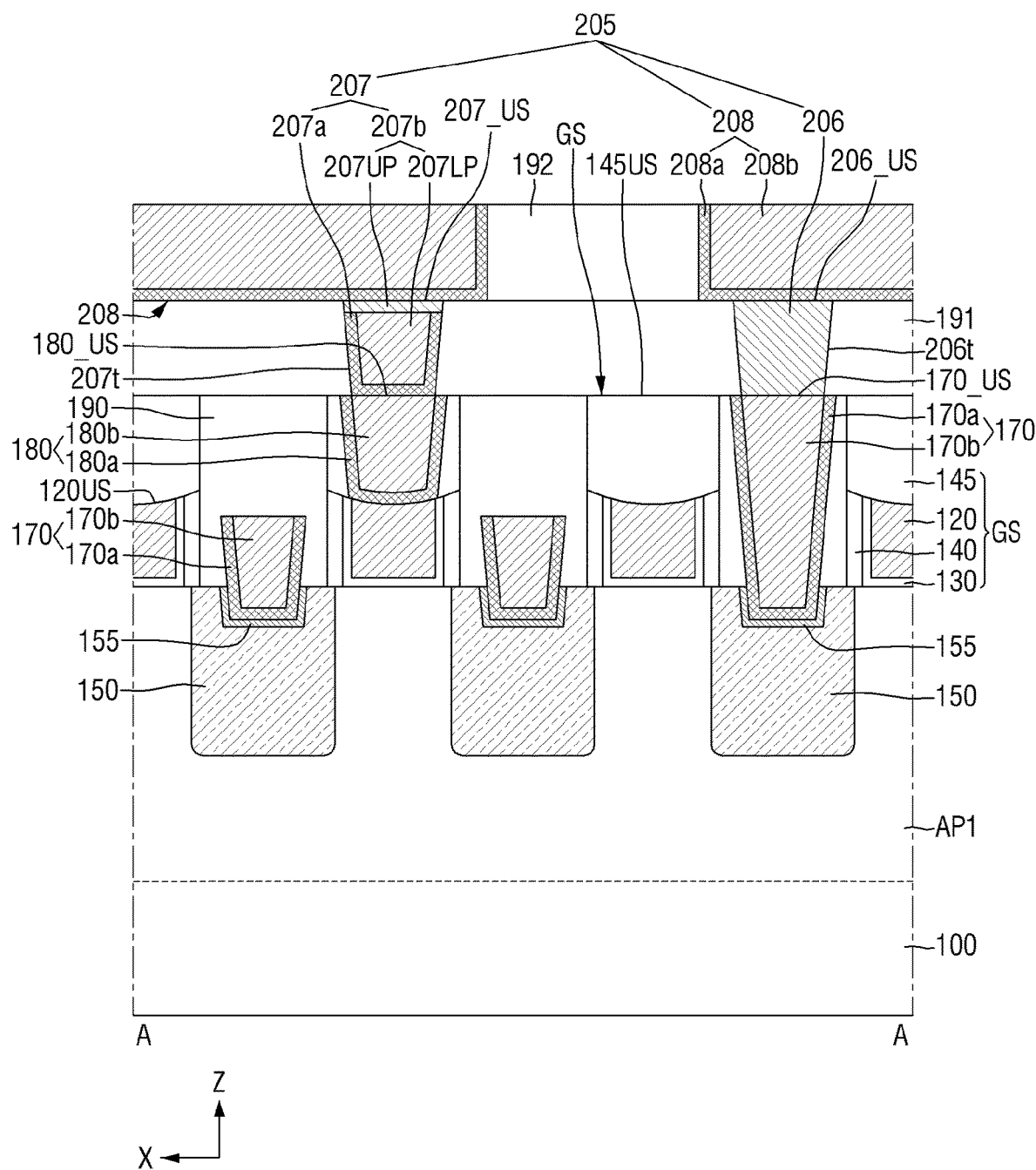
FIG. 12 is a diagram for explaining the semiconductor device according to some embodiments.
Figure 13:
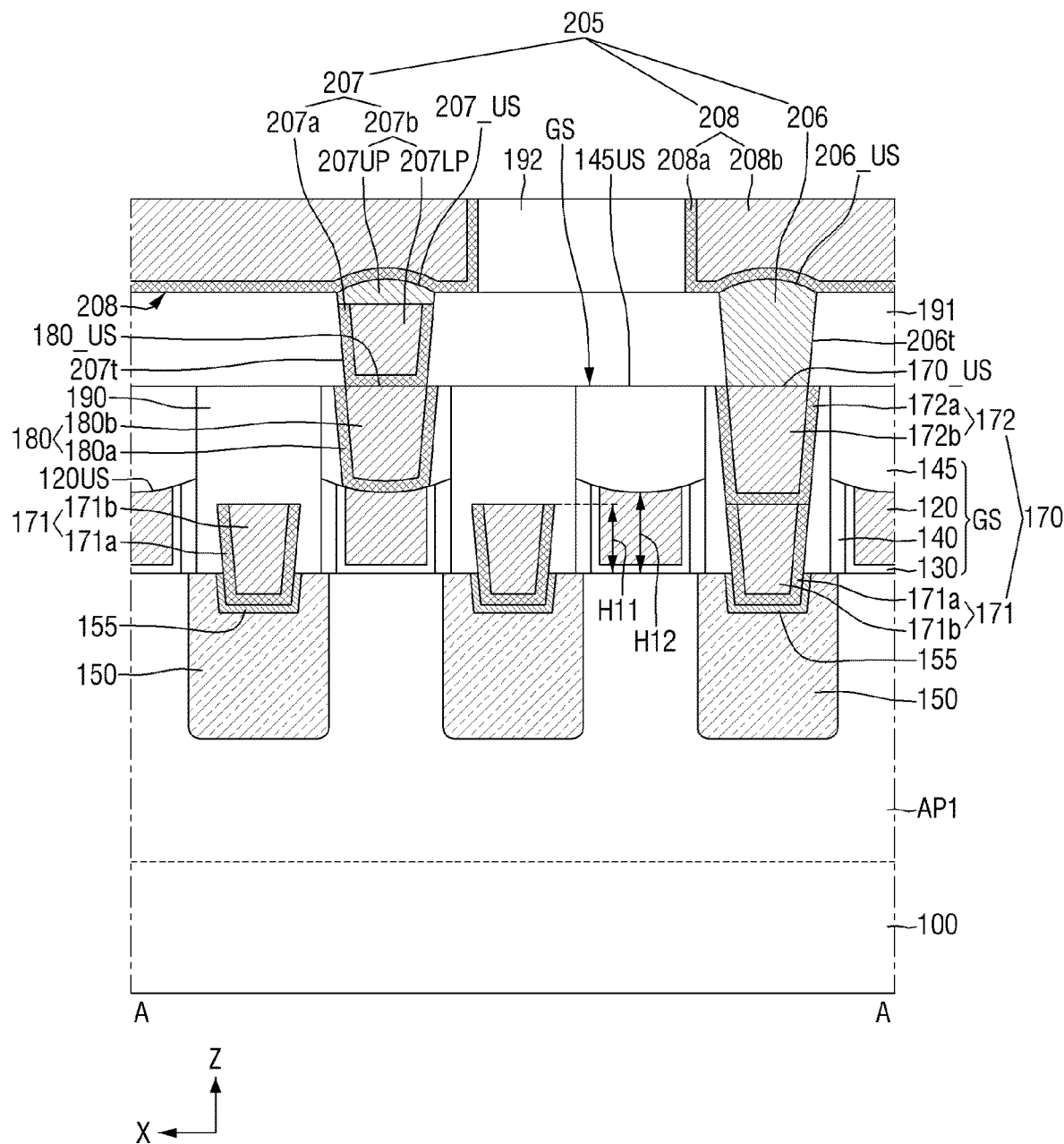
FIGS. 13 and 14 are diagrams for explaining the semiconductor device according to some embodiments.
Figure 14:
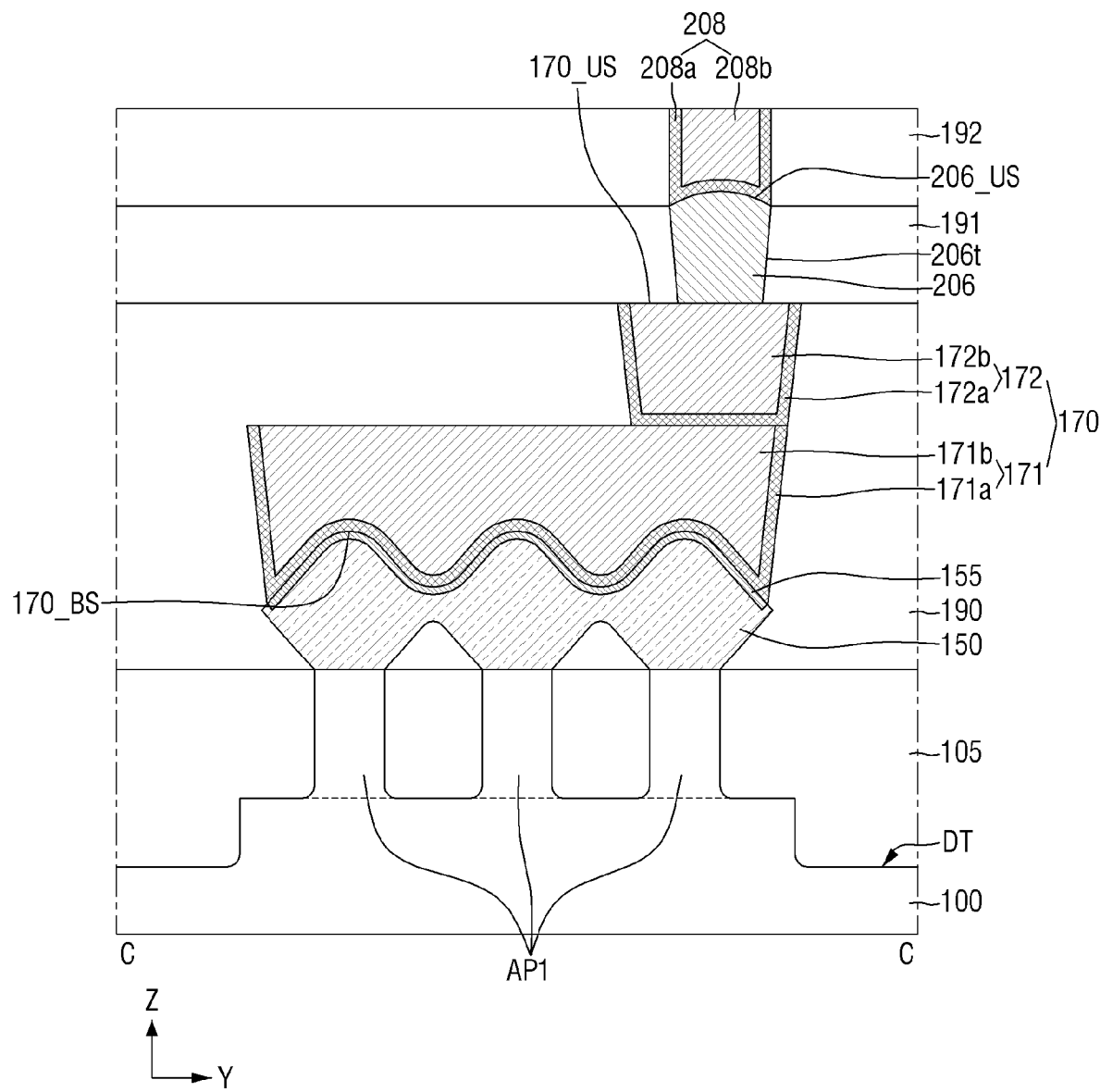

FIGS. 10 and 11 are diagrams for explaining the semiconductor device according to some embodiments. FIG. 12 is a diagram for explaining the semiconductor device according to some embodiments. FIGS. 13 and 14 are diagrams for explaining the semiconductor device according to some embodiments. For convenience of explanation, the points different from the contents described using FIGS. 1 to 5B will be mainly described. For reference, FIG. 11 is an enlarged view of a portion P of FIG. 10. FIGS. 13 and 14 are cross-sectional views taken along A-A and C-C of FIG. 10.

Referring to FIGS. 10 and 11, in the semiconductor device according to some embodiments, the via barrier film 207a does not extend along the side wall 207LP SW of the lower via filling film. In other words, the via barrier film 207a is between the lower via filling film 207LP and the gate filling film 180b, but not on the sidewall of the lower via filling film 207LP adjacent the second interlayer insulating film 191.

The via barrier film 207a extends along the bottom face of the second via hole 207t and does not extend along the side wall of the second via hole 207t.

Referring to FIG. 12, in the semiconductor device according to some embodiments, the upper face 206 US of the first via plug and/or the upper face 207_US of the second via plug may each be flat planes.

For example, the upper face 206 US of the first via plug may be in the same plane as the upper face (191US of FIG. 3) of the second interlayer insulating film. The upper face 207_US of the second via plug may be in the same plane as the upper face 191US of the second interlayer insulating film.

Referring to FIGS. 13 and 14, in the semiconductor device according to some embodiments, the first source/drain contact 170 may include a lower source/drain contact 171 and an upper source/drain contact 172.

The lower source/drain contact 171 may include a lower source/drain barrier film 171a and a lower source/drain filling film 171b. The upper source/drain contact 172 may include an upper source/drain barrier film 172a and an upper source/drain filling film 172b.

The upper face 170 US of the first source/drain contact may be the upper face of the upper source/drain contact 172.

Contents of the materials in the lower source/drain barrier film 171a and the upper source/drain barrier film 172a may be the same as the description of the first source/drain barrier film 170a. Contents of the materials in the lower source/drain filling film 171b and the upper source/drain filling film 172b may be the same as the description of the first source/drain filling film 170b.

As an example, the height H12 from the upper face of the first active pattern AP1 to the upper face 120US of the gate electrode may be greater than the height H11 from the upper face of the first active pattern AP1 to the upper face of the lower source/drain contact 171. As another example, the height H12 from the upper face of the first active pattern AP1 to the upper face 120US of the gate electrode may be the same as the height H11 from the upper face of the first active pattern AP1 to the upper face of the lower source/drain contact 171. As another example, the height H12 from the upper face of the first active pattern AP1 to the upper face 120US of the gate electrode may be smaller than the height H11 from the upper face of the first active pattern AP1 to the upper face of the lower source/drain contact 171.

The first via plug 206 is connected to the upper source/drain contact 172.

Figure 15:
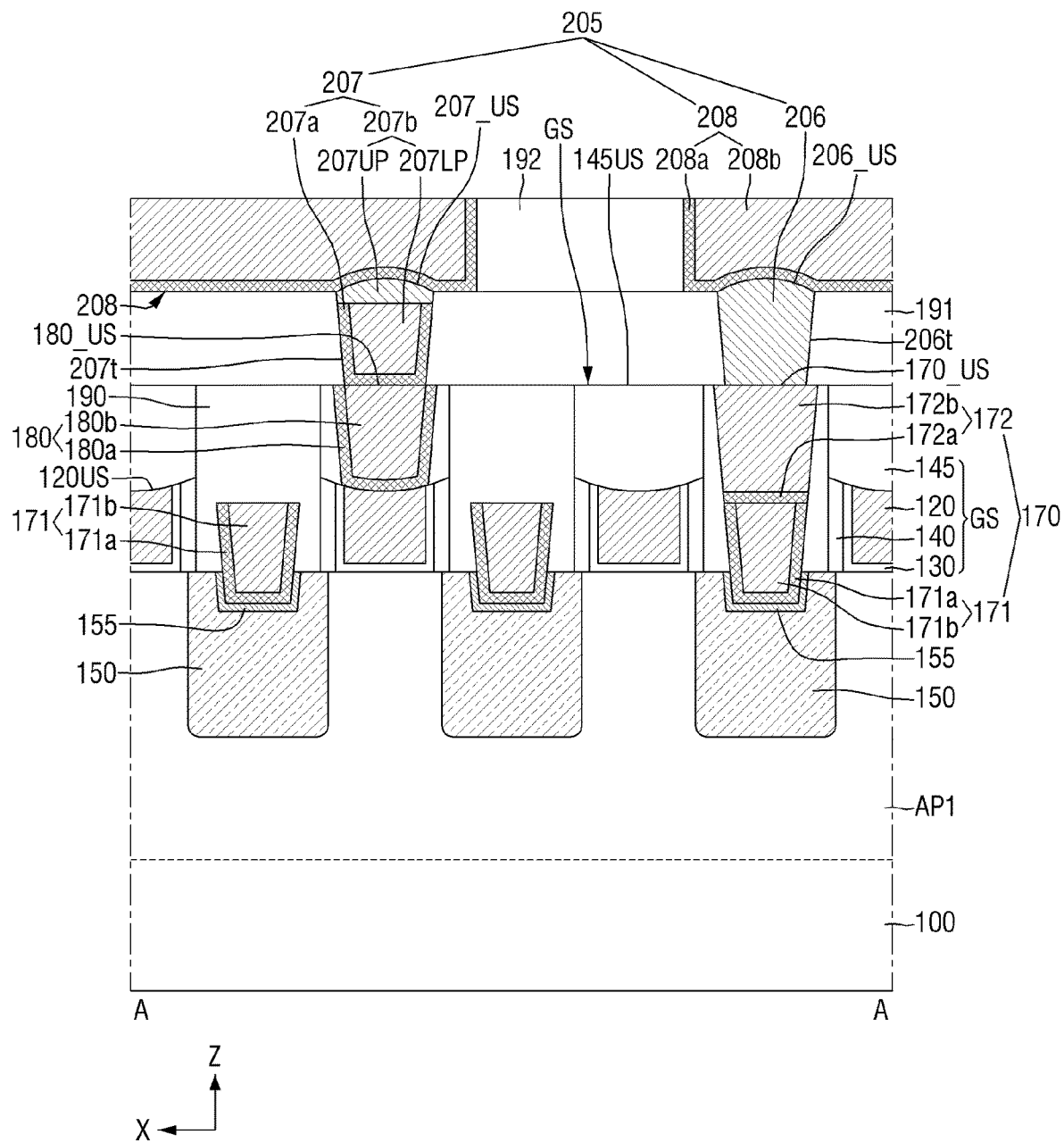
FIG. 15 is a diagram for explaining the semiconductor device according to some embodiments.

FIG. 15 is a diagram for explaining the semiconductor device according to some embodiments. For convenience of explanation, the points different from the contents described using FIGS. 13 and 14 will be mainly described.

Referring to FIG. 15, the upper source/drain barrier film 172a does not extend along the side wall of the upper source/drain filling film 172b.

The upper source/drain barrier film 172*a* may be formed only on the bottom face of the upper source/drain filling film 172*b*.

Unlike the shown case, in the gate contact 180, the gate barrier film 180*a* may not extend along the side wall of the gate filling film 180*b*.

Figure 16:
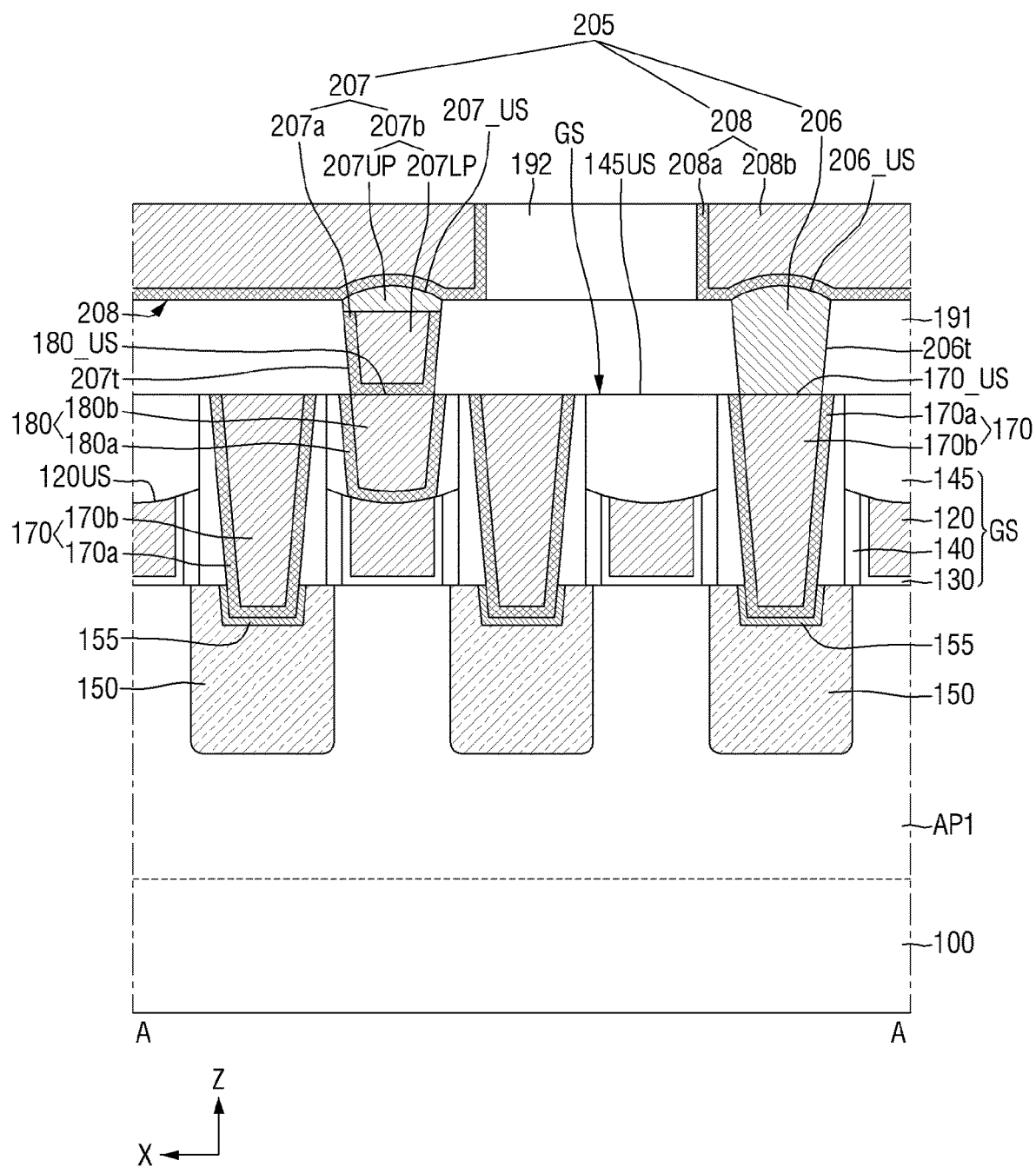
FIG. 16 is a diagram for explaining the semiconductor device according to some embodiments.
Figure 17:
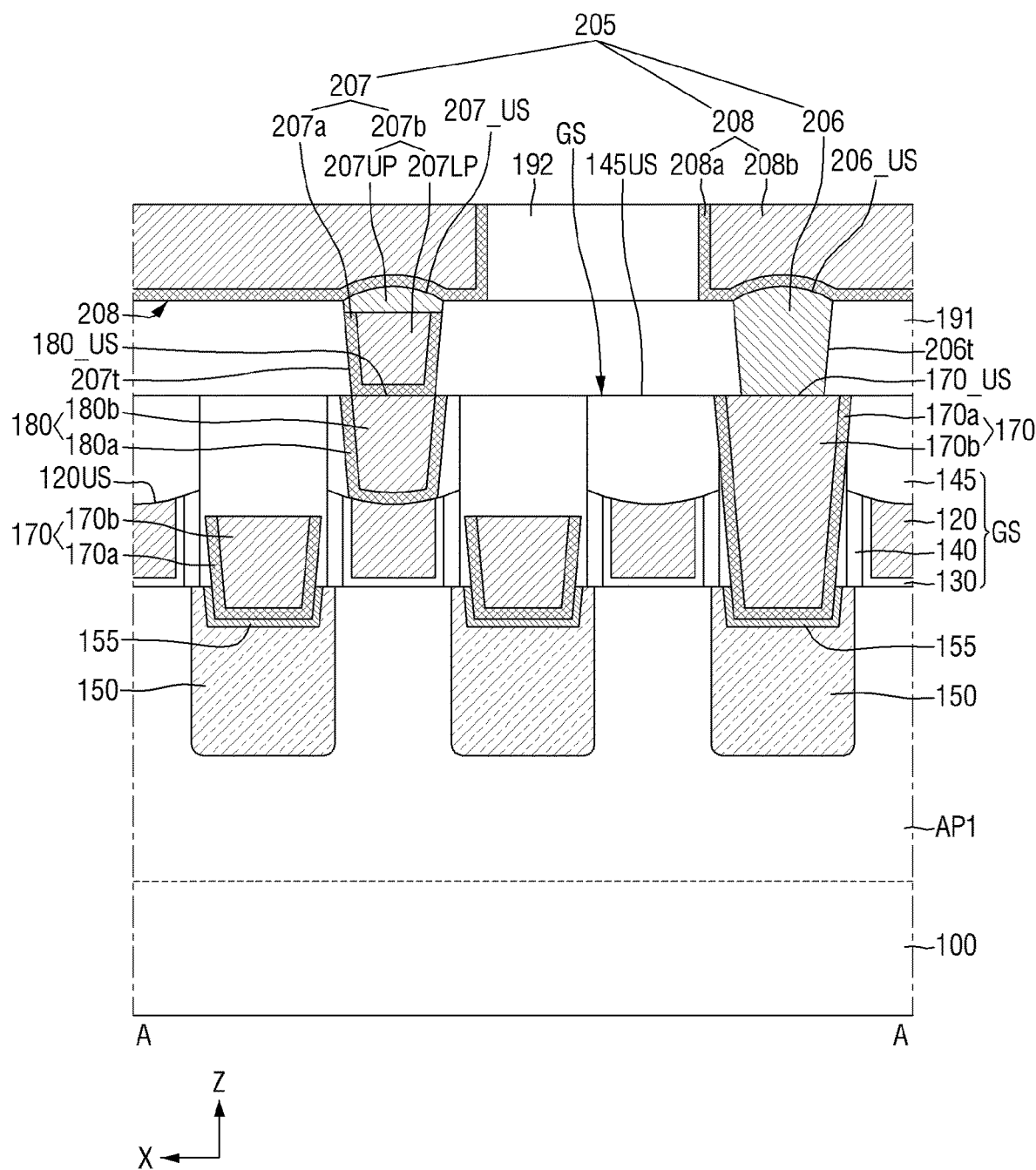
FIG. 17 is a diagram for explaining the semiconductor device according to some embodiments.
Figure 18:
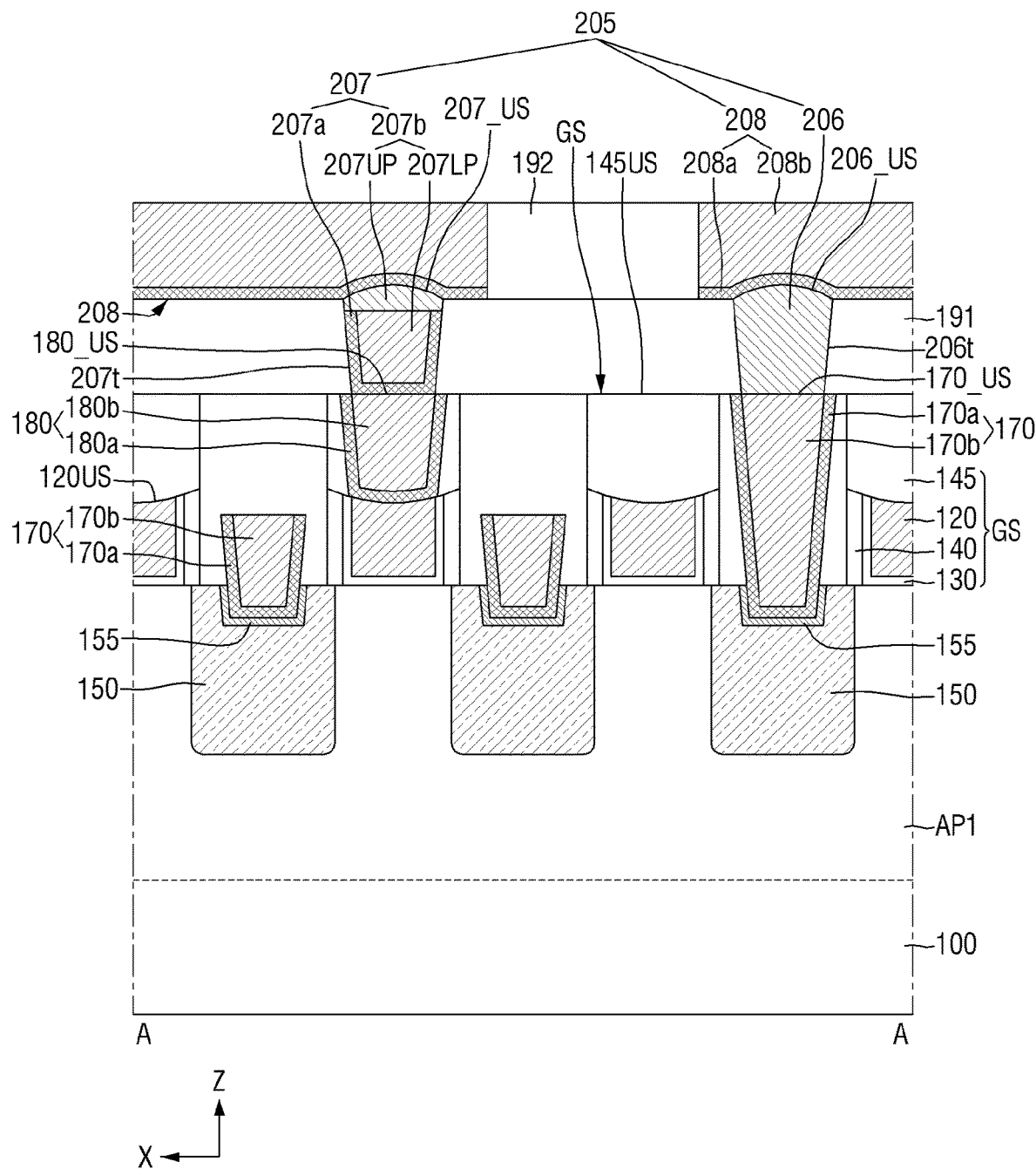
FIG. 18 is a diagram for explaining the semiconductor device according to some embodiments.
Figure 19:
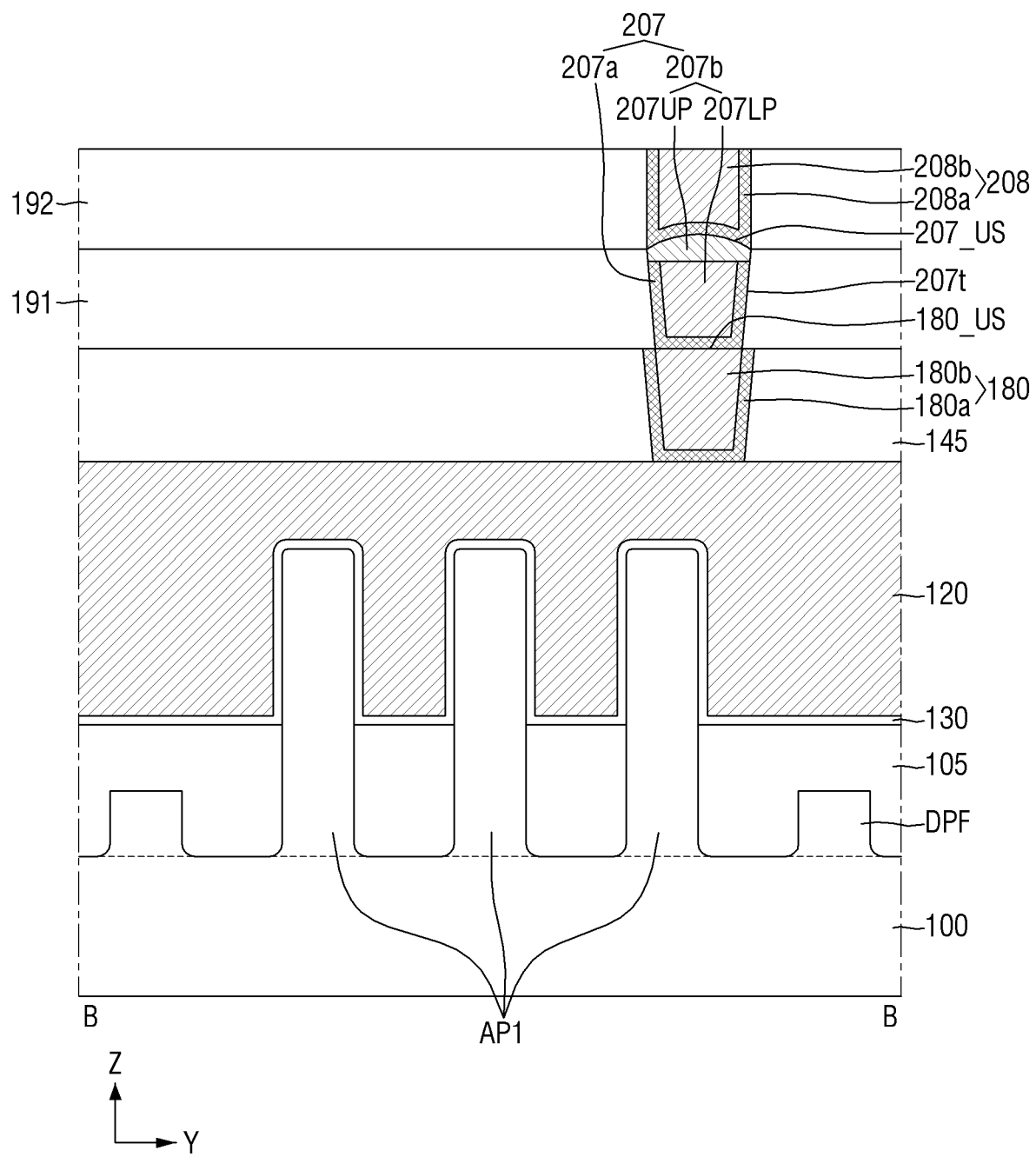
FIG. 19 is a diagram for explaining the semiconductor device according to some embodiments.
Figure 20:
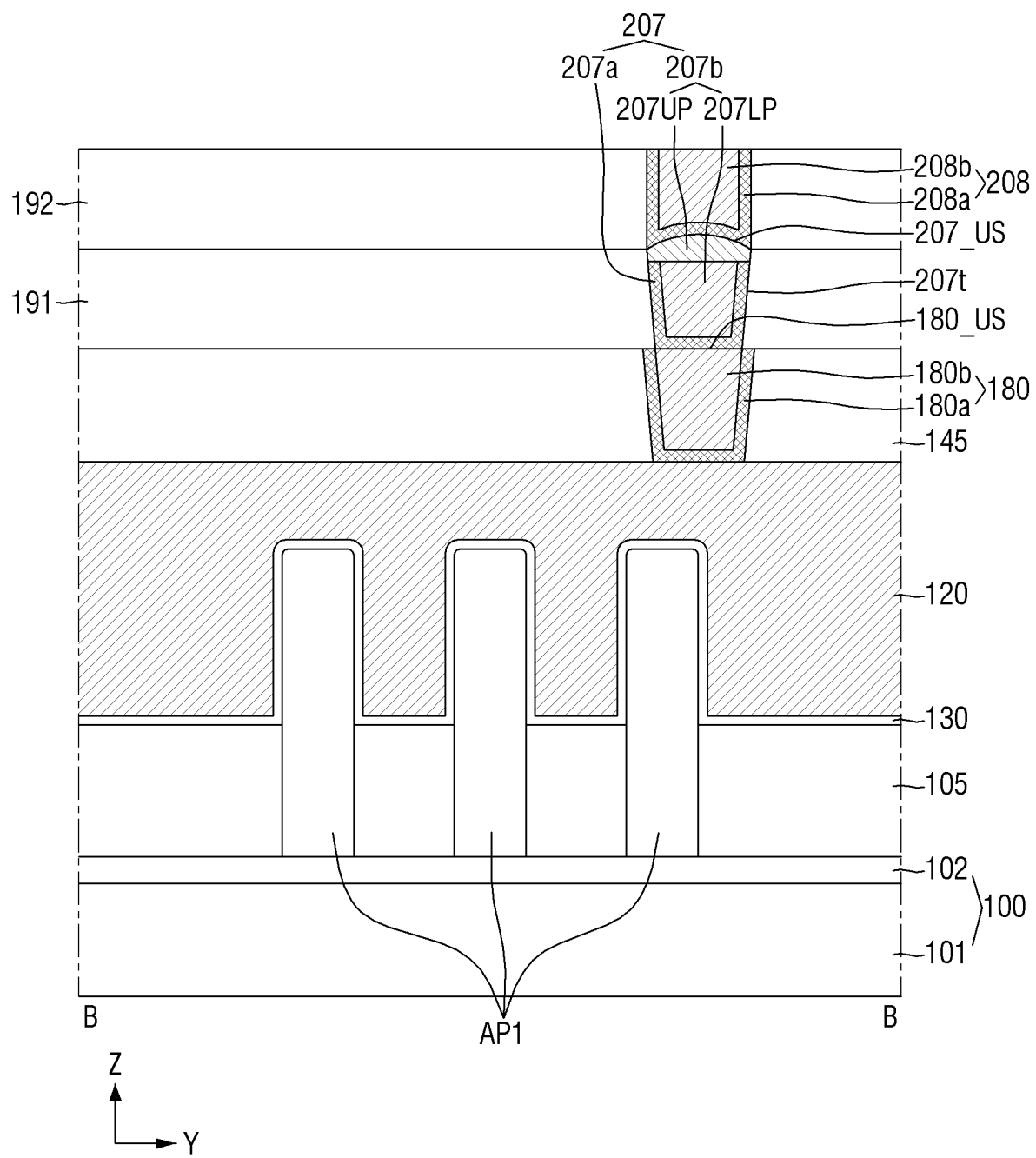
FIG. 20 is a diagram for explaining the semiconductor device according to some embodiments.

FIG. 16 is a diagram for explaining the semiconductor device according to some embodiments. FIG. 17 is a diagram for explaining a semiconductor device according to some embodiments. FIG. 18 is a diagram for explaining the semiconductor device according to some embodiments. FIG. 19 is a diagram for explaining the semiconductor device according to some embodiments. FIG. 20 is a diagram for explaining a semiconductor device according to some embodiments. For convenience of explanation, the points different from the contents described using FIGS. 1 to 5B will be mainly described.

Referring to FIG. 16, in the semiconductor device according to some embodiments, the height of the first source/drain contact 170 may be constant on the basis of the upper face of the first active pattern AP1, regardless of landing of the wiring structure 205.

When the first source/drain contact 170 includes a first portion in which the wiring structure 205 is not landed and a second portion in which the wiring structure 205 is landed, the height of the upper face of the second portion of the first source/drain contact 170 may be the same as the height of the upper face of the first portion of the first source/drain contact 170.

Referring to FIG. 17, in the semiconductor device according to some embodiments, the first source/drain contact 170 may be in contact with the gate structures GS placed on both sides.

The portion of the first source/drain contact 170 on which the wiring structure 205 is landed may be in contact with the gate structure GS adjacent in the first direction X. The first source/drain contact 170 may be self-aligned between the gate structures GS.

Referring to FIG. 18, in the semiconductor device according to some embodiments, the wiring barrier film 208*a* does not extend along the side wall of the wiring filling film 208*b*.

Referring to FIG. 19, the semiconductor device according to some embodiments may include a dummy protrusion pattern DPF formed in the field region FX. No deep trench (DT of FIG. 2A) is formed in the field region FX.

The upper face of the dummy protrusion pattern DPF is covered with or overlapped by a field insulating film 105.

Referring to FIG. 20, in the semiconductor device according to some embodiments, the substrate 100 may include a base substrate 101, and a buried insulating film 102 on the base substrate 101.

The base substrate 101 may include, but is not limited to, a semiconductor material. The buried insulating film 102 may be formed entirely along the upper face of the base substrate 101. The buried insulating film 102 may include an insulating material.

Figure 21:
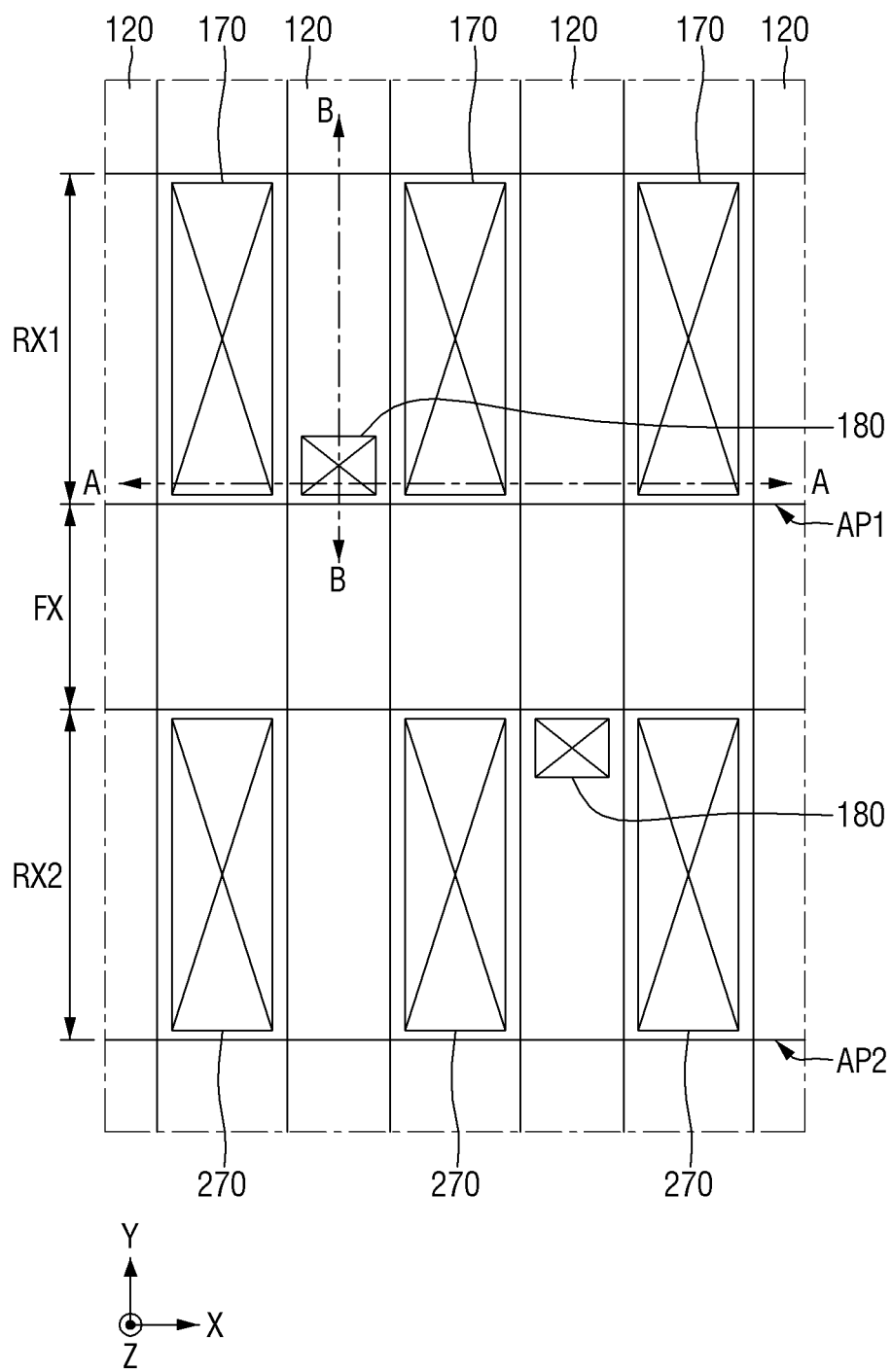
FIGS. 21 to 24 are diagrams for explaining the semiconductor device according to some embodiments.
Figure 22:
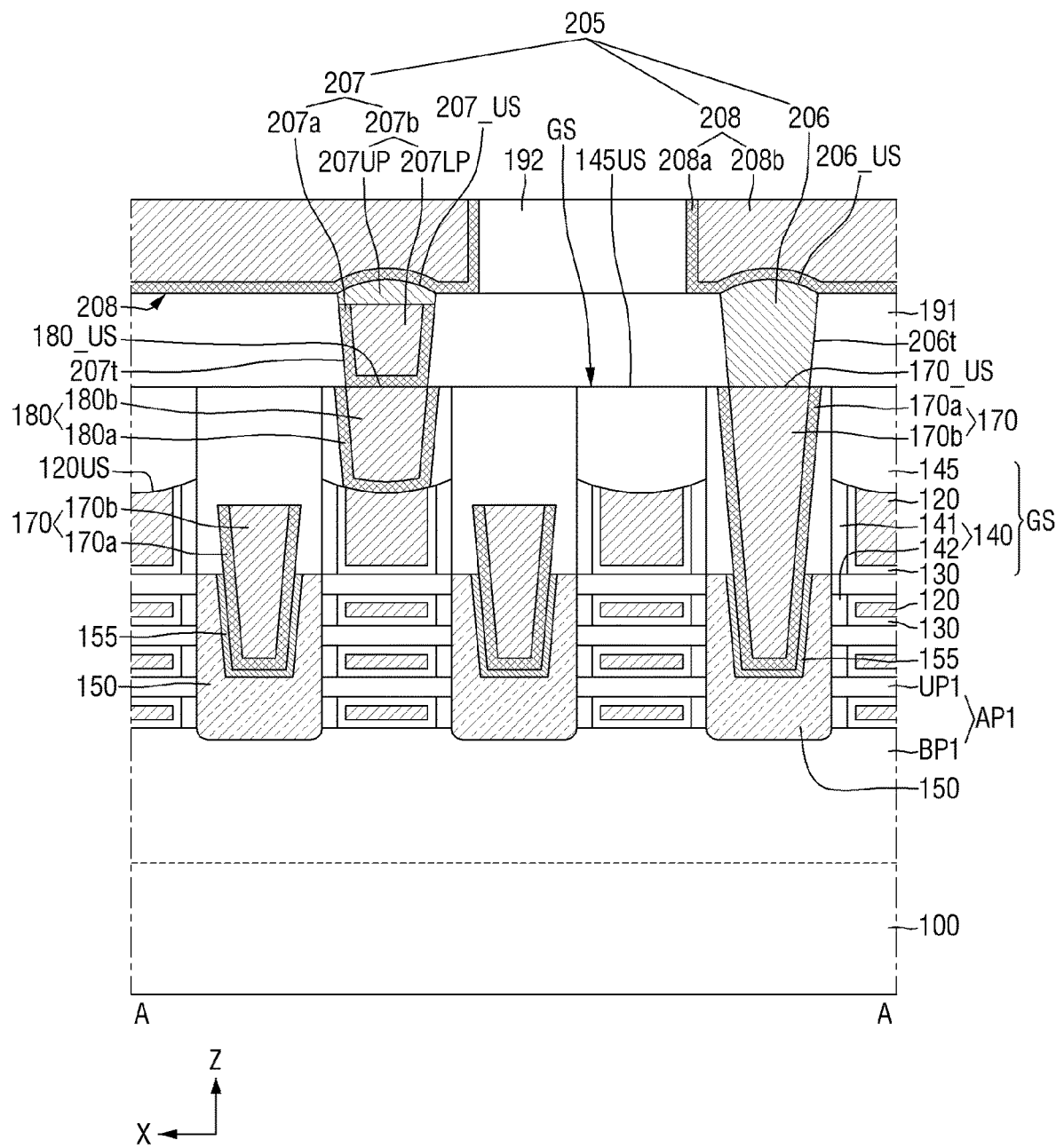
Figure 23:
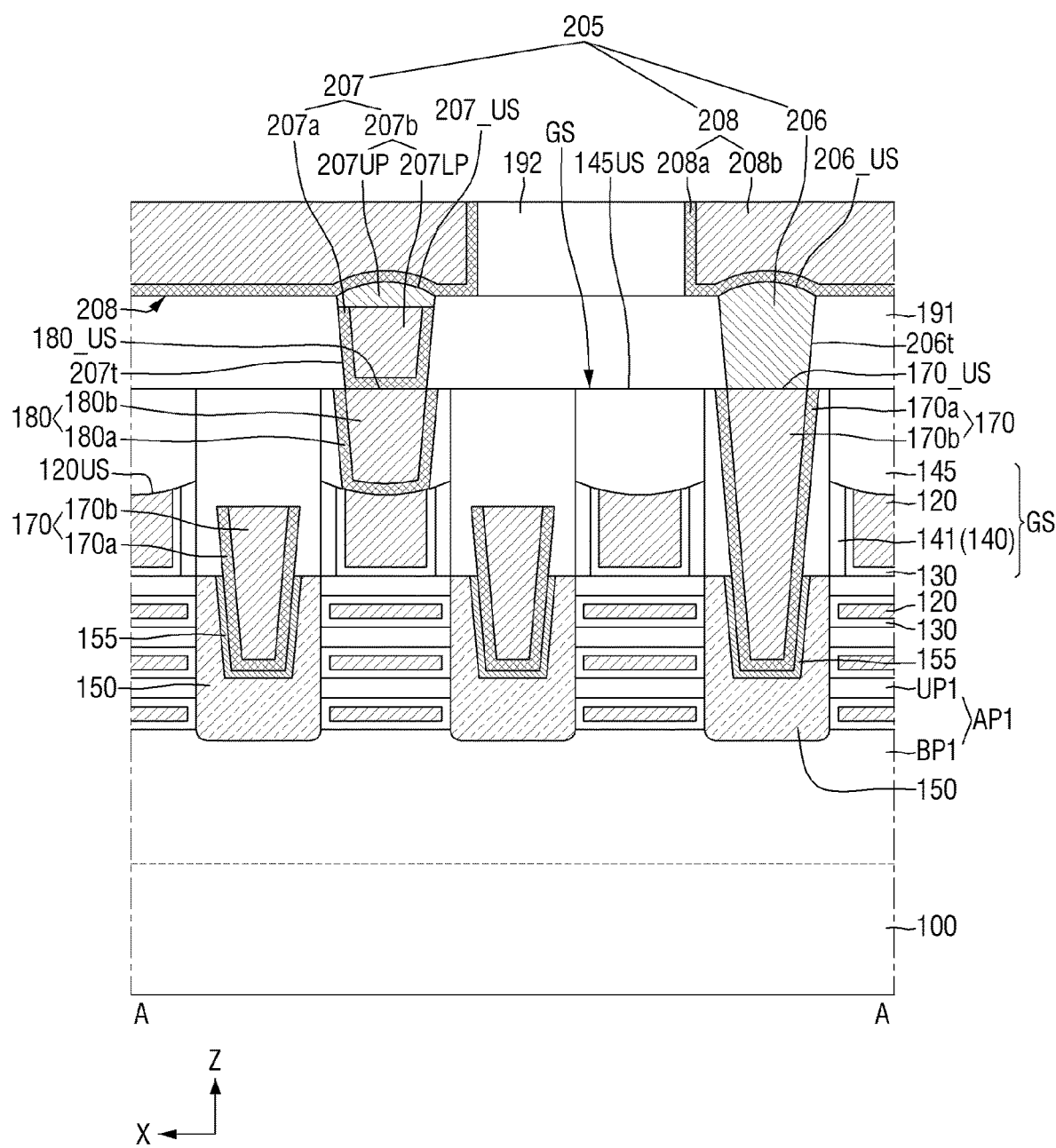
Figure 24:
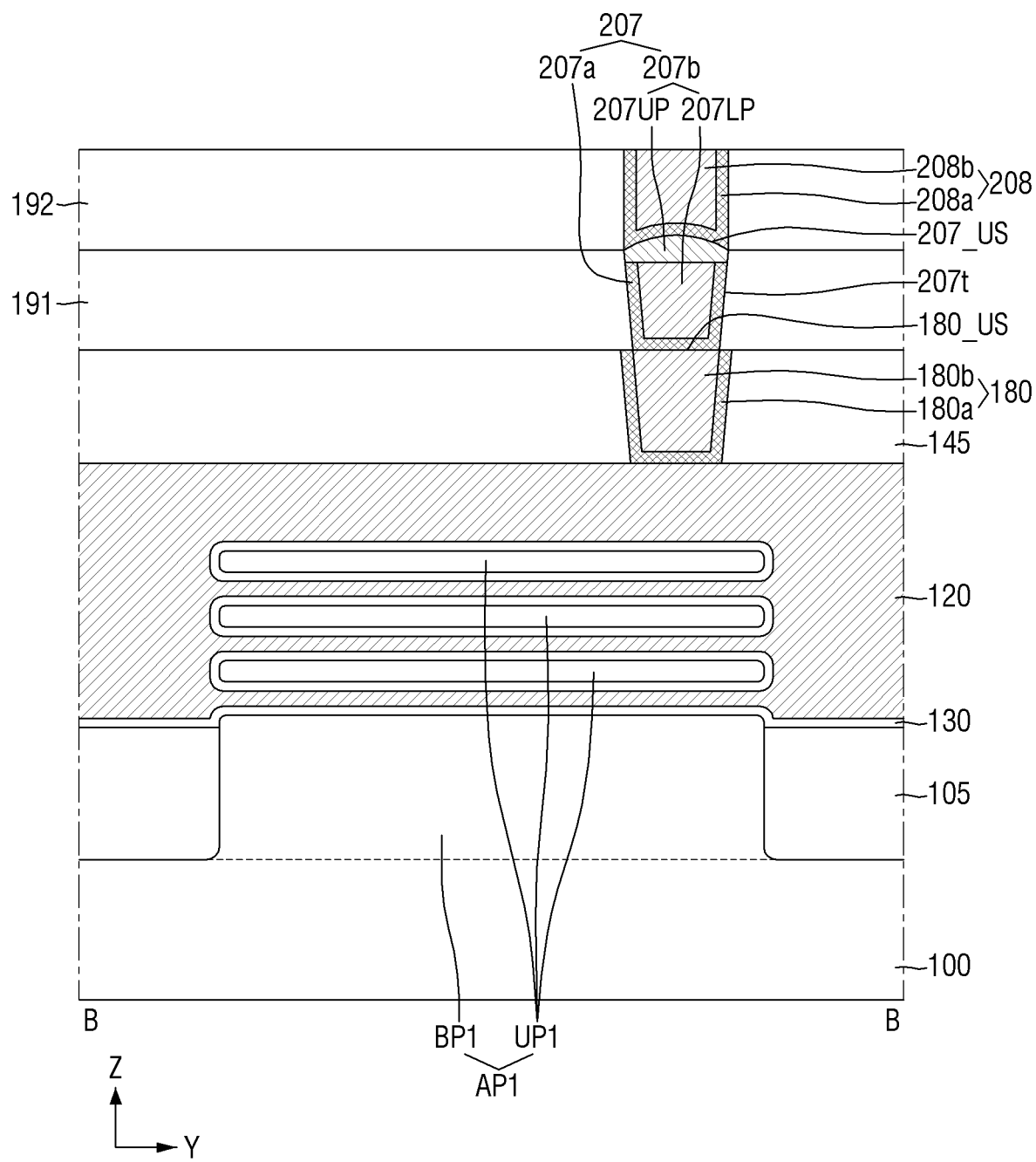

FIGS. 21 to 24 are diagrams for explaining a semiconductor device according to some embodiments. FIG. 21 is an example layout diagram for explaining a semiconductor device according to some embodiments. FIGS. 22 and 23 are example cross-sectional views taken along a line A-A of FIG. 21, respectively. FIG. 24 is a cross-sectional view taken along a line B-B of FIG. 21. For convenience of explanation, the points different from the contents described using FIGS. 1 to 5B will be mainly described.

Referring to FIGS. 21 to 24, in the semiconductor device according to some embodiments, the first active pattern AP1 may include a lower pattern BP1 and a sheet pattern UP1.

Although not shown, the second active pattern AP2 may include a lower pattern and a sheet pattern.

The lower pattern BP1 may extend along the first direction X. The sheet pattern UP1 may be placed on the lower pattern BP1 to be spaced apart from the lower pattern BP1.

The sheet pattern UP1 may include a plurality of sheet patterns stacked in the third direction Z. Although the three sheet patterns UP1 are shown, this is only for convenience of explanation, and the number thereof is not limited thereto.

The sheet pattern UP1 may be connected to the source/drain pattern 150. The sheet pattern UP1 may be a channel pattern used as a channel region of a transistor. For example, the sheet pattern UP1 may be nanosheet or nanowire.

The gate insulating film 130 may extend along the upper face of the lower pattern BP1 and the upper face of the field insulating film 105. The gate insulating film 130 may wrap around the sheet pattern UP1.

The gate electrode 120 is placed on the lower pattern BP1. The gate electrode 120 intersects the lower pattern BP1. The gate electrode 120 may wrap around the sheet pattern UP1. The gate electrode 120 may be placed between the lower pattern BP1 and the sheet pattern UP1, and between the adjacent sheet patterns UP1.

In FIG. 22, the gate spacer 140 may include an outer spacer 141 and an inner spacer 142. The inner spacer 142 may be placed between the lower pattern BP1 and the sheet pattern UP1, and between the adjacent sheet patterns UP1.

In FIG. 23, the gate spacer 140 may include only the outer spacer 141. No inner spacer is placed between the lower pattern BP1 and the sheet pattern UP1, and between the adjacent sheet patterns UP1.

The bottom face of the first source/drain contact 170 may be between the upper face of the sheet pattern UP1 placed at the lowermost part of the plurality of sheet patterns UP1 and the lower face of the sheet pattern UP1 placed at the uppermost part.

Figure 25:
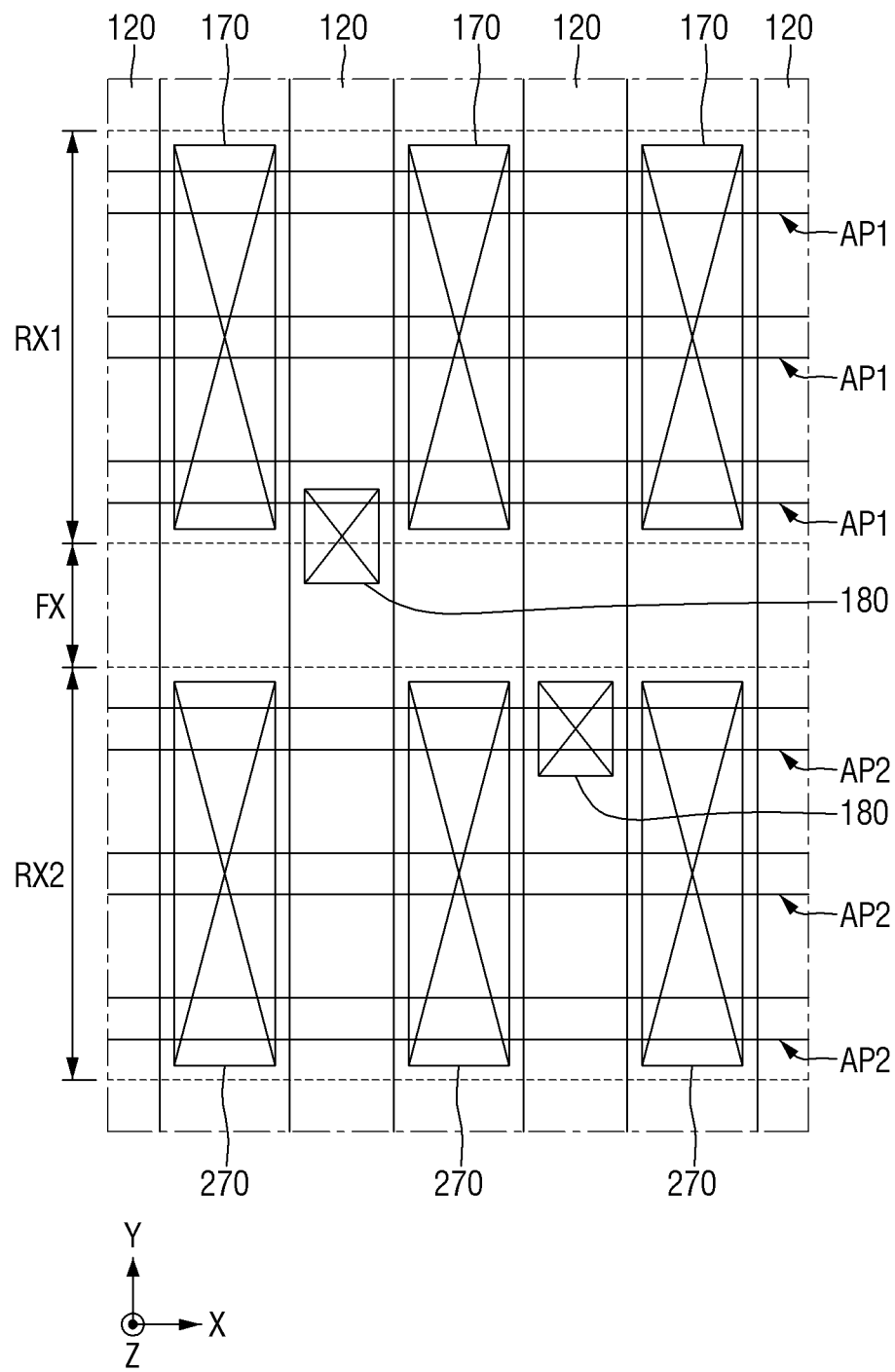
FIGS. 25 and 26 are example layout diagrams for explaining semiconductor devices according to some embodiments, respectively.
Figure 26:
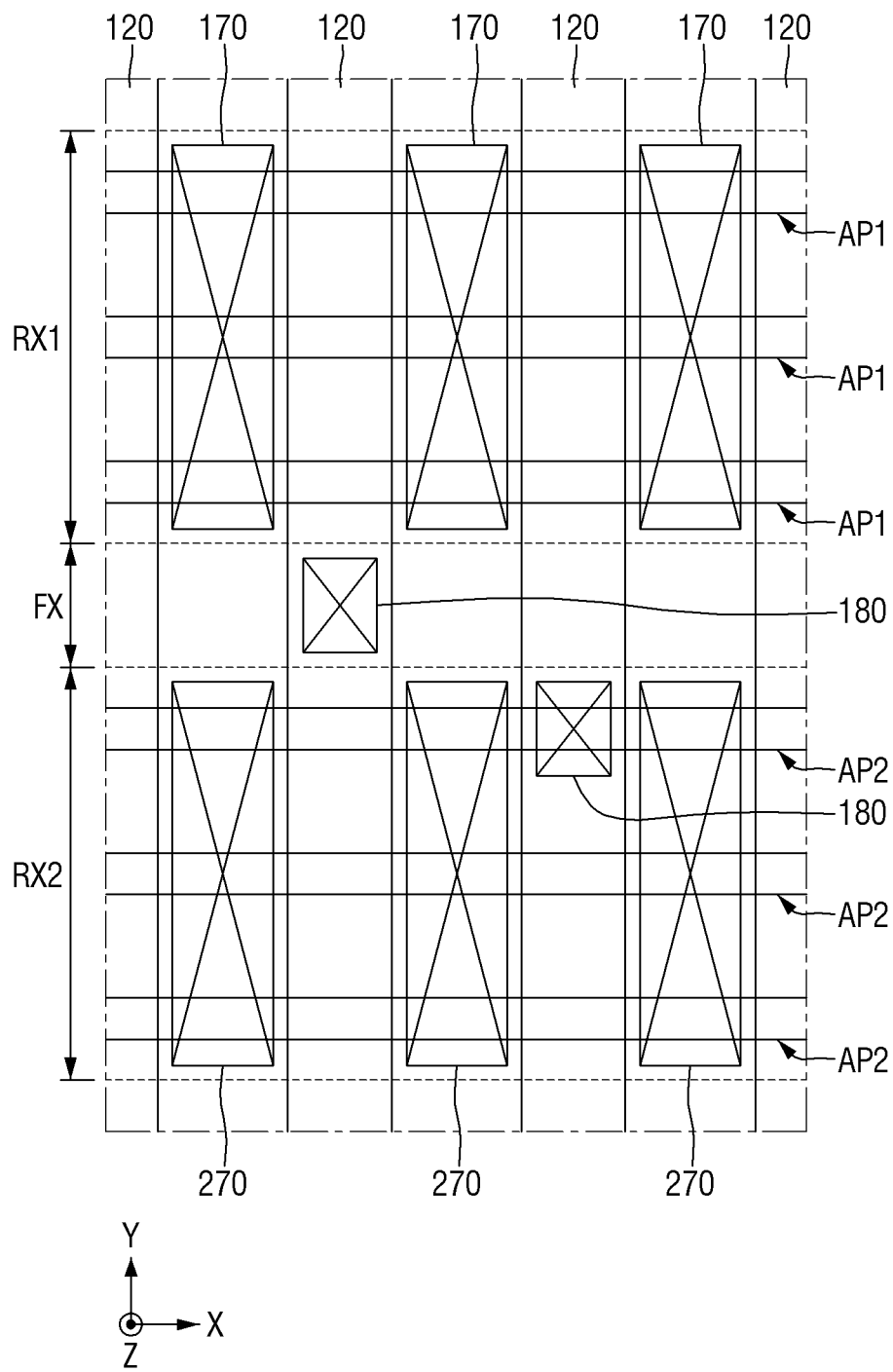
Figure 27:
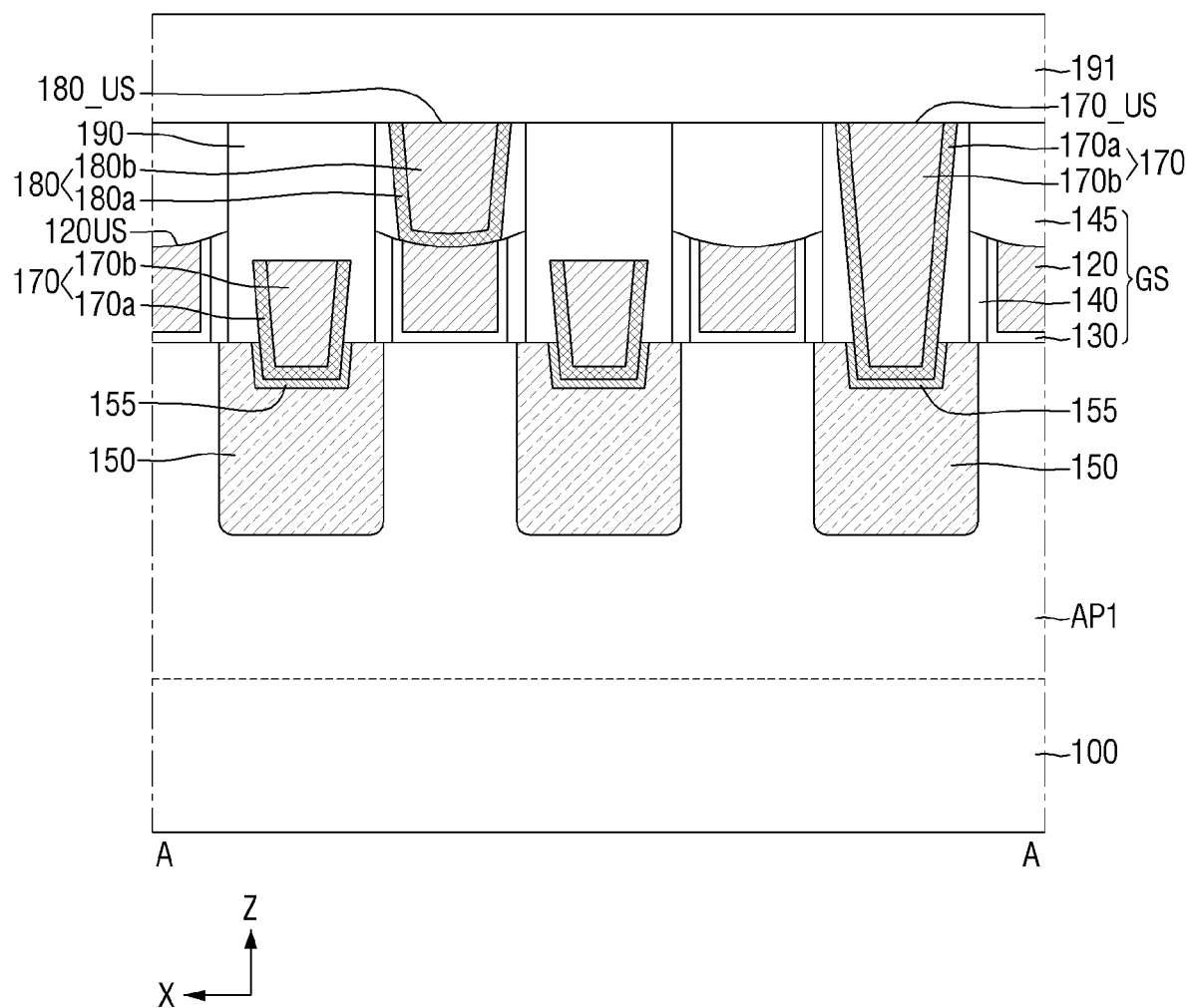
FIGS. 27 to 34 are intermediate stage diagrams for explaining a method for fabricating the semiconductor device according to some embodiments.

FIGS. 25 and 26 are example layout diagrams for explaining a semiconductor device according to some embodiments, respectively. For convenience of explanation, the points different from the contents described using FIGS. 1 to 5B will be mainly described.

Referring to FIG. 25, in the semiconductor device according to some embodiments, at least one of the gate contact 180 may be placed over the active regions RX1 and RX2 and the field region FX.

For example, a part of the gate contact 180 may be at a position where it overlaps the first active region RX1.

Referring to FIG. 26, in the semiconductor device according to some embodiments, at least one of the gate contacts 180 may be entirely on the field region FX.

The gate contact 180 may be at a position where it entirely overlaps the field region FX.

In FIGS. 25 and 26, although at least one of the gate contacts 180 is shown as being entirely placed on the second active region RX2, the embodiment is not limited thereto.

In FIGS. 1, 25 and 26, a cross section (a drawing taken in the second direction Y) of each first source/drain contact 170, and a cross section of the second source/drain contact 270 may have an "L" shape or a "T" shape rotated by 180 degrees, depending on the position of the gate contact 180.

Or, regardless of the position of the gate contact 180, each of the first source/drain contact 170 and the second source/drain contact 270 may not include a recessed portion as shown in FIG. 5A.

FIGS. 27 to 34 are intermediate stage diagrams for explaining a method for fabricating the semiconductor device according to some embodiments. For reference, FIGS. 27 to 34 may be cross-sectional views taken along a line A-A of FIG. 1. The following fabricating method will be described in terms of the cross-sectional view Referring to FIG. 27, a gate structure GS and a source/drain pattern 150 may be formed on the first active pattern AP1.

Subsequently, a first source/drain contact 170 may be formed on the source/drain pattern 150. Further, a gate contact 180 may be formed on the gate electrode 120.

Subsequently, a second interlayer insulating film 191 is formed on the gate contact 180 and the first source/drain contact 170.

Figure 28:
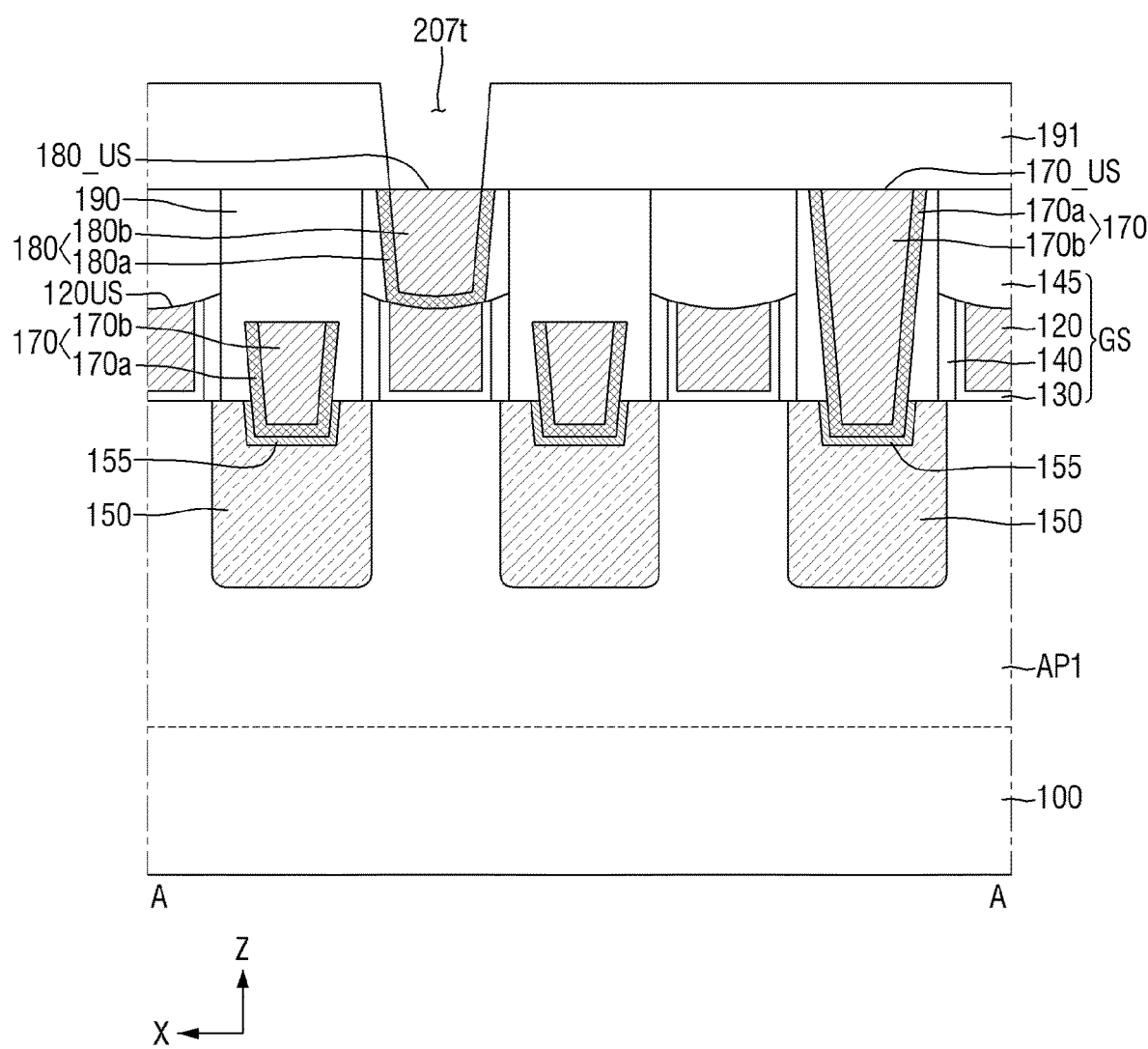

Referring to FIG. 28, a second via hole 207t may be formed in the second interlayer insulating film 191.

The second via hole 207t may expose the gate contact 180.

Figure 29:
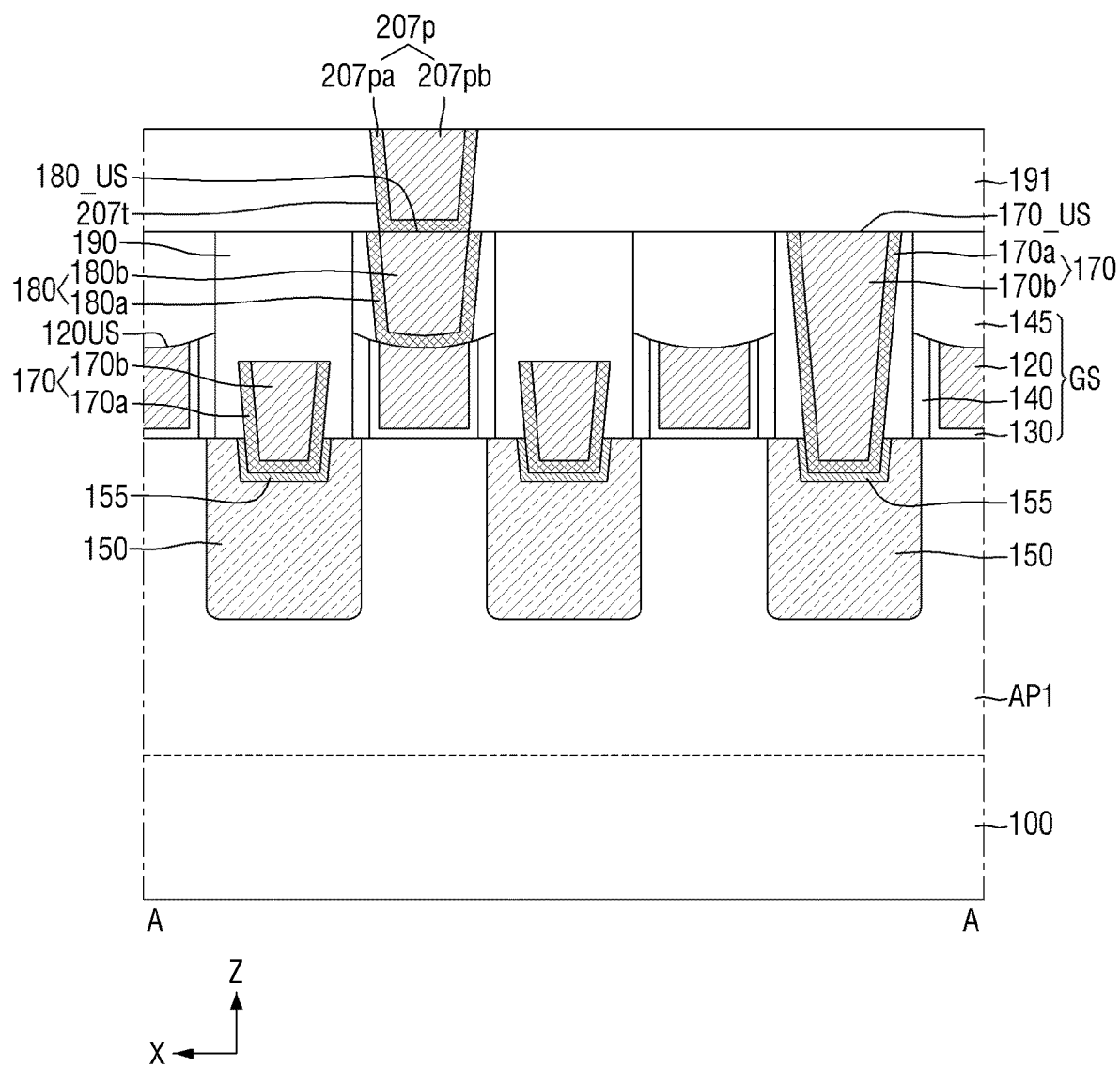

Referring to FIG. 29, a pre second via plug 207p may be formed in the second via hole 207t.

The second pre via plug 207p may include a pre via barrier film 207pa and a pre via plug film 207pb.

The pre via barrier film 207pa may extend along the side walls and bottom face of the second via hole 207t. The pre via plug film 207pb is formed on the pre via barrier film 207pa.

Figure 30:
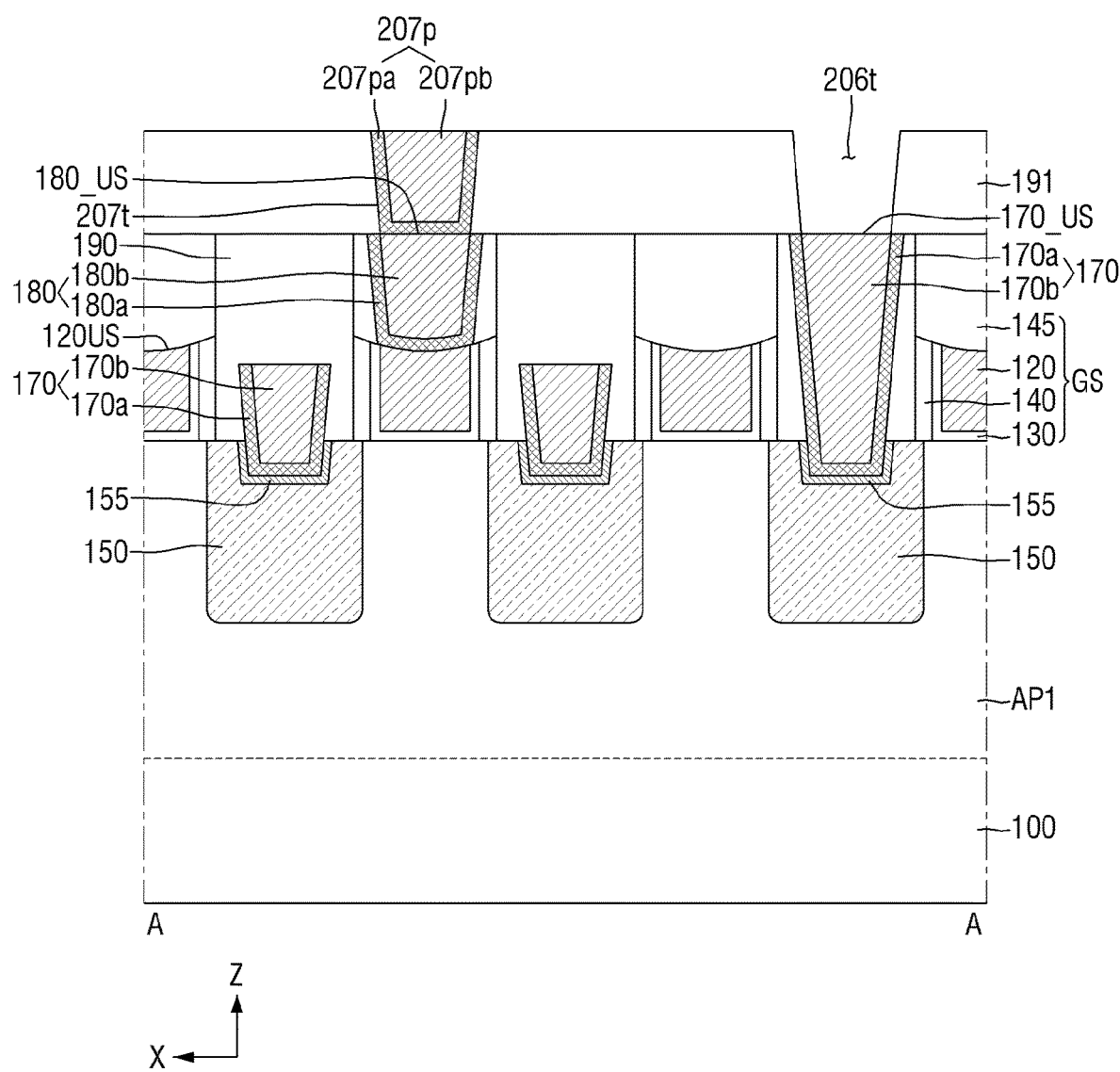

Referring to FIG. 30, the first via hole 206t may be formed in the second interlayer insulating film 191.

The first via hole 206t may expose the first source/drain contact 170.

Figure 31:
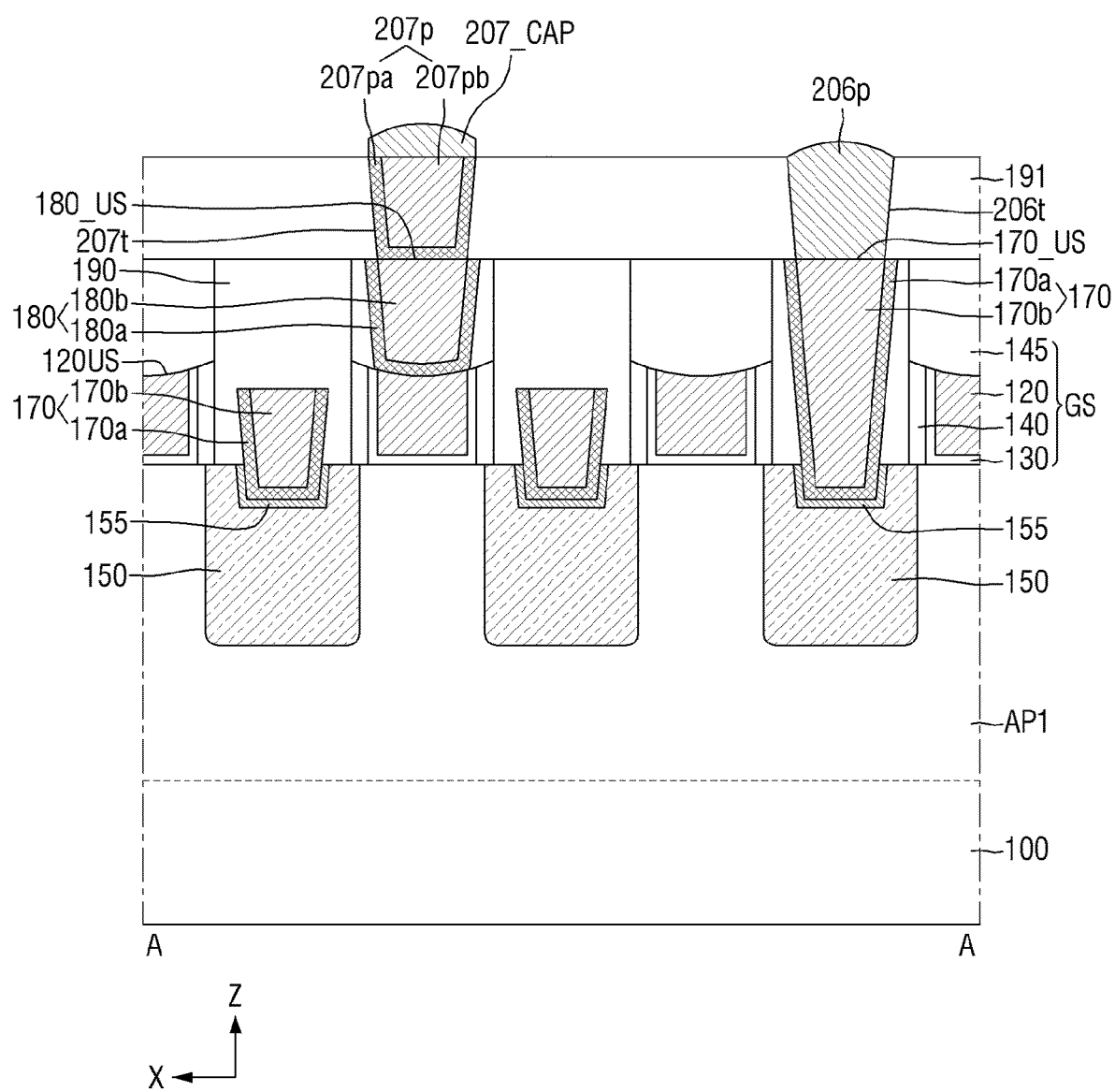

Referring to FIG. 31, the first pre via plug 206p may be formed in the first via hole 206t. The first pre via plug 206p may fill the first via hole 206t.

The first pre via plug 206p may be formed, for example, by utilizing a selective chemical vapor deposition. The first pre via plug 206p may be selectively deposited on, for example, a conductive material. The first pre via plug 206p includes, for example, tungsten (W).

The upper face of the first pre via plug 206p may have a convex curved face. The first pre via plug 206p may be formed of a single grain.

While the first pre via plug 206p is being formed, a capping conductive pattern 207_CAP may be formed on the upper face of the second pre via plug 207p.

Figure 32:
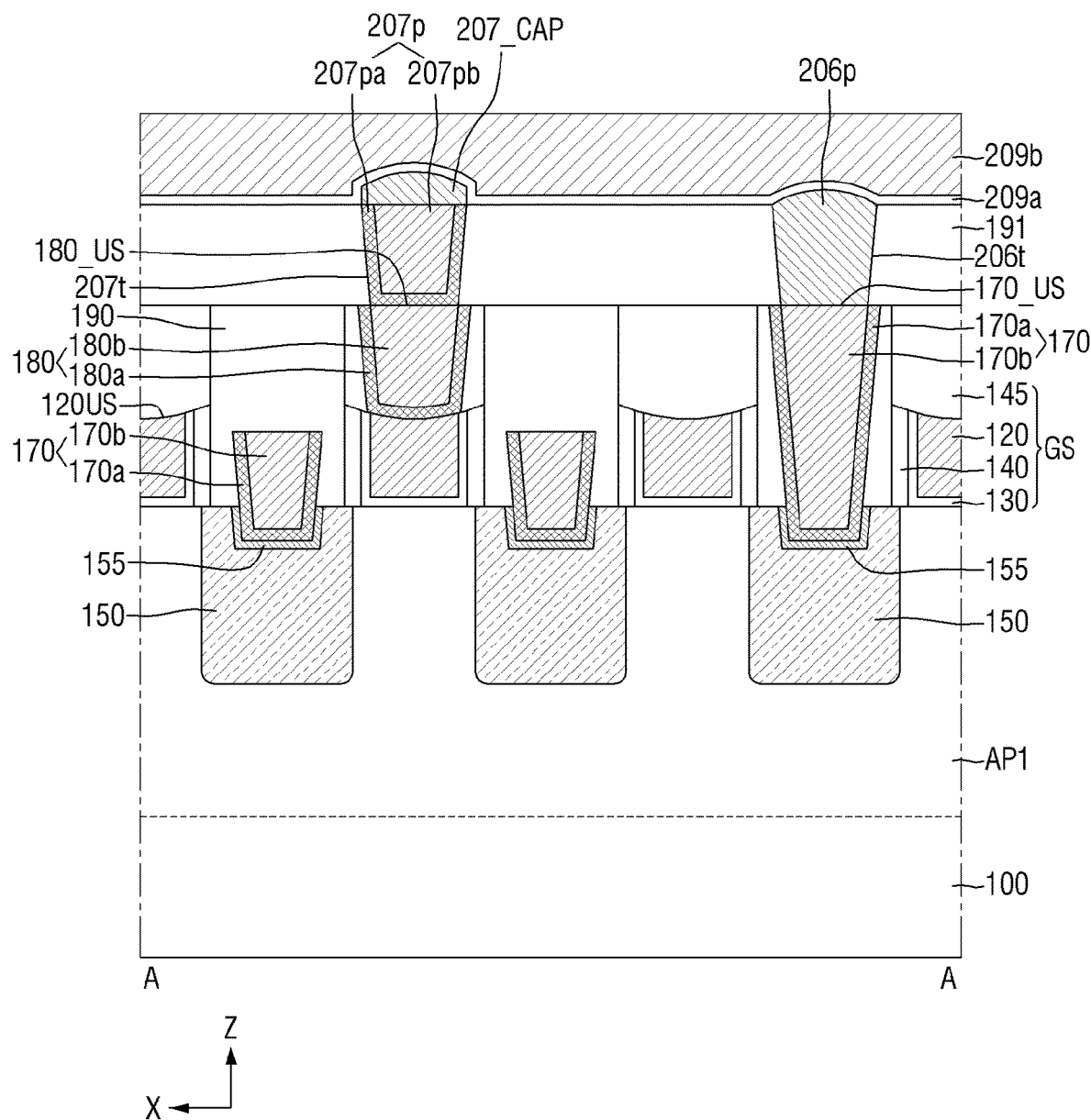

Referring to FIG. 32, the barrier liner film 209a may be formed along the profile of the upper face 191US of the second interlayer insulating film, the upper face of the first pre via plug 206p, and the capping conductive pattern 207_CAP.

Subsequently, a bulk conductive film 209b may be formed on the barrier liner film 209a. An upper face of the bulk conductive film 209b may be flat.

Figure 33:
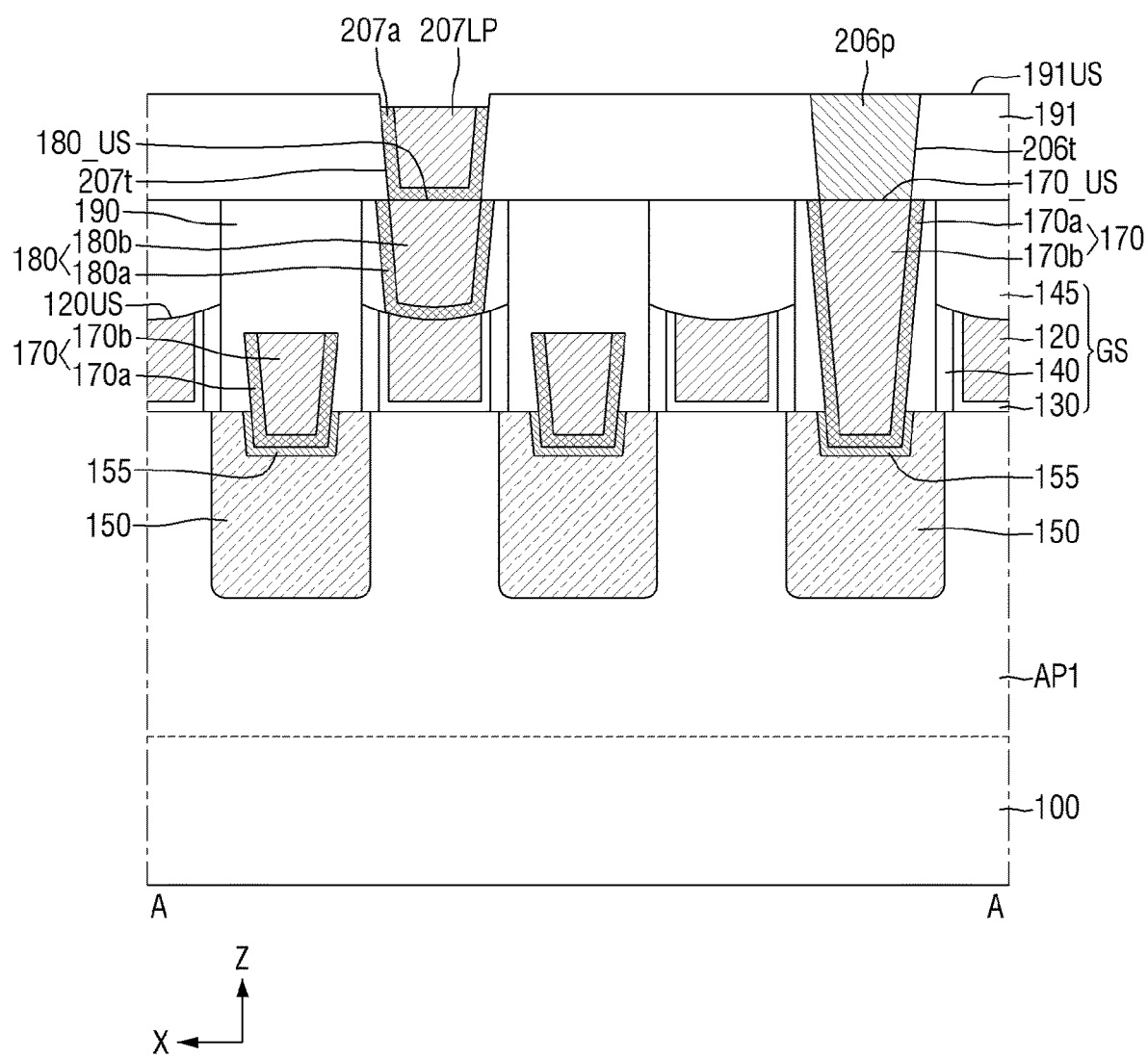

Referring to FIG. 33, the bulk conductive film 209b and the barrier liner film 209a on the upper face 191US of the second interlayer insulating film may be removed, using a chemical mechanical polishing (CMP) process.

While the chemical mechanical polishing (CMP) process is being performed, the capping conductive pattern 207_CAP protruding from the upper face 191US of the second interlayer insulating film may also be removed. Also, the upper face of the first pre via plug 206p may also be flattened.

While the chemical mechanical polishing (CMP) process is being performed, the second pre via plug 207p in the second via hole 207t may be over-etched. That is, a part of the second pre via plug 207p that fills the second via hole 207t may be removed. The via barrier film 207a extending along a part of the side wall and bottom face of the second via hole 207t may be formed through the chemical mechanical polishing (CMP) process. Also, a lower via plug 207LP that fills a part of the second via hole 207t may be formed.

Figure 34:
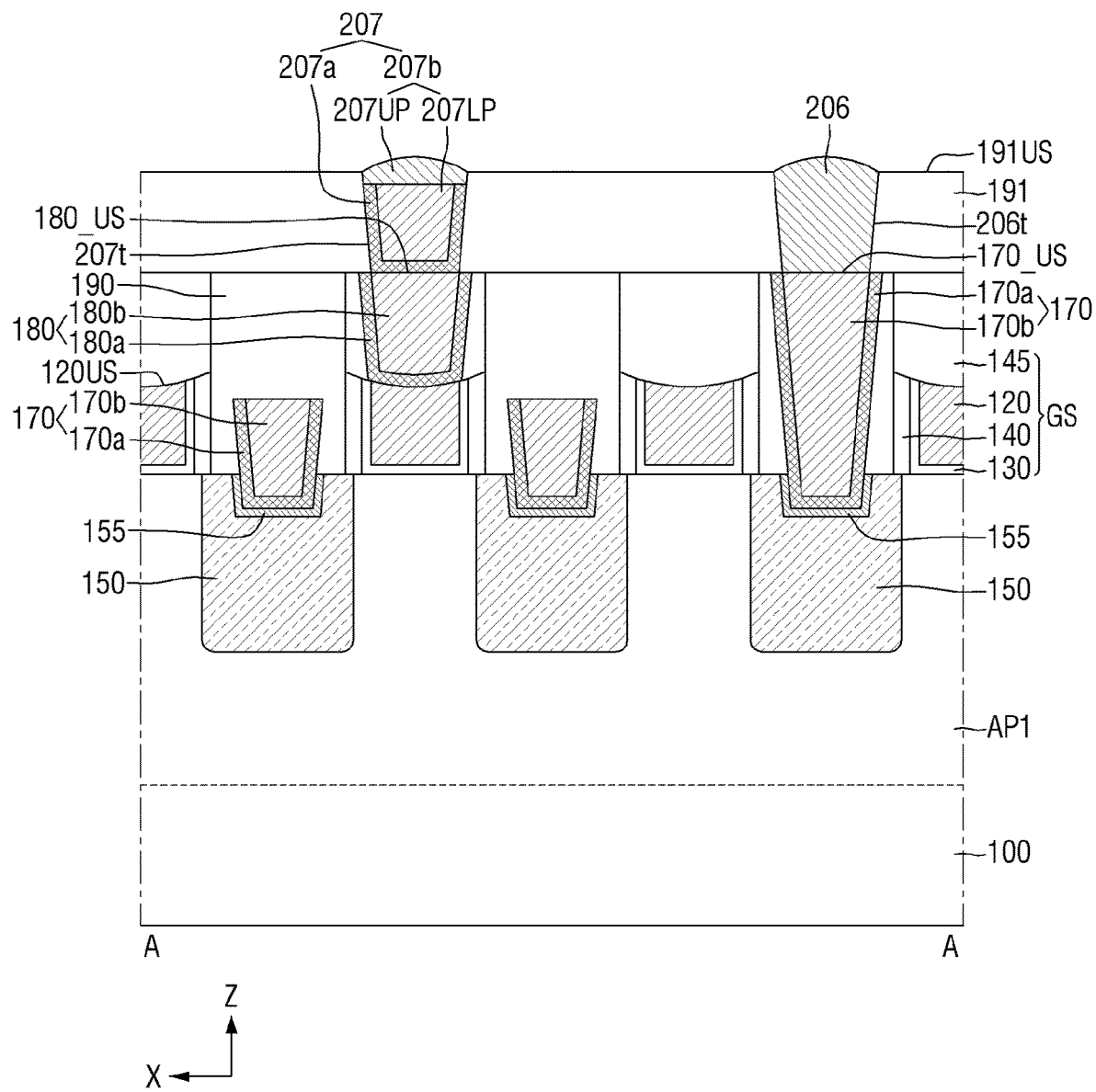

Referring to FIG. 34, an upper via plug 207UP that fills the rest of the second via hole 207t may be formed. The first via plug 207 that fills the second via hole 207t may be formed accordingly.

As an example, the upper via plug 207UP may be formed using a selective chemical vapor deposition method. The upper via plug 207UP may include tungsten (W).

Tungsten (W) may also be deposited on the first pre via plug (206p of FIG. 33), while the upper via plug 207UP is being formed. A first via plug 206 that fills the first via hole 206t may be formed accordingly.

A part of the first via plug 206 and a part of the second via plug 207 may protrude upward from the upper face 191US of the second interlayer insulating film. The upper face of the first via plug 206 and the upper face of the second via plug 207 may have a convex curved face.

Unlike the shown case, as another example, the upper via plug 207UP may also be formed, using a chemical vapor deposition. In such a case, the tungsten film may also be formed on the upper face 191US of the second interlayer insulating film. The chemical mechanical polishing process of removing the tungsten film on the upper face 191US of the second interlayer insulating film may be performed.

Subsequently, as an example, a wiring line (208 of FIG. 2A) may be formed on the first via plug 206 and the second via plug 207.

As another example, a process of flattening the upper faces of the first via plug 206 and the second via plug 207 may be performed, before the wiring line (208 of FIG. 2A) is formed.

In concluding the detailed description, those skilled in the art will appreciate that many variations and modifications may be made to the example embodiments without substantially departing from the principles of the present inventive concept. Therefore, the disclosed example embodiments of the invention are used in a generic and descriptive sense only and not for purposes of limitation.

What is claimed is:

1. A semiconductor device comprising:
   a gate structure comprising a gate electrode on a substrate;
   a source/drain pattern on the substrate;
   a source/drain contact electrically connected to the source/drain pattern;
   a gate contact electrically connected to the gate electrode; and
   a wiring structure electrically connected to the source/drain contact and the gate contact,
   wherein the wiring structure comprises a first via plug, a second via plug, and a wiring line electrically connected to the first via plug and the second via plug,
   wherein the first via plug comprises a single conductive film structure,
   wherein the second via plug comprises a via barrier film, a lower via filling film, and an upper via filling film on the lower via filling film,
   wherein the via barrier film does not overlap a side wall of the upper via filling film in a direction parallel to an upper surface of the substrate, and
   wherein an upper surface of the via barrier film is lower than an upper surface of the lower via filling film with respect to the substrate.

2. The semiconductor device of claim 1, wherein the via barrier film extends along a bottom face of the lower via filling film.

3. The semiconductor device of claim 2,
wherein the via barrier film extends along a side wall of the lower via filling film, and
wherein the upper via filling film overlaps an upper face of the lower via filling film.

4. The semiconductor device of claim 3, wherein a height from the bottom face of the lower via filling film to the upper face of the lower via filling film is different from a height from the bottom face of the lower via filling film to an upper face of the via barrier film.

5. The semiconductor device of claim 2, wherein the via barrier film does not extend along a side wall of the upper via filling film.

6. The semiconductor device of claim 1, wherein a material of the first via plug is same as a material of the upper via filling film.

7. The semiconductor device of claim 1,
wherein the first via plug is electrically connected to the source/drain contact, and
wherein the second via plug is electrically connected to the gate contact.

8. The semiconductor device of claim 1, wherein an upper face of the first via plug has a convex curved face.

9. The semiconductor device of claim 1,
wherein the gate structure comprises a gate capping pattern on the gate electrode, and
wherein an upper face of the gate contact is coplanar with an upper face of the gate capping pattern.

10. The semiconductor device of claim 1, wherein the source/drain contact comprises a lower source/drain contact, and an upper source/drain contact on the lower source/drain contact.

11. The semiconductor device of claim 1,
wherein the first via plug and the upper via filling film each comprise tungsten (W).

12. The semiconductor device of claim 1, further comprising:
an interlayer insulating film below the wiring line,
wherein the first via plug and the second via plug are in the interlayer insulating film,
wherein a part of the first via plug and a part of the upper via filling film protrude upward from an upper face of the interlayer insulating film, and
wherein an upper face of the first via plug and an upper face of the upper via filling film comprise a convex curved face.

13. The semiconductor device of claim 1, wherein each of the first via plug and the upper via filling film are made up of a single grain.

14. The semiconductor device of claim 1, wherein a top surface of the first via plug is convex curved shaped and is coplanar with a top surface of the second via plug that is convex curved shaped.

15. A semiconductor device comprising:
a gate structure on a substrate, the gate structure comprising a gate electrode and a gate capping pattern on the gate electrode;
a source/drain pattern;
a source/drain contact electrically connected to the source/drain pattern;
a gate contact electrically connected to the gate electrode; and
a wiring structure electrically connected to the source/drain contact and the gate contact,
wherein the wiring structure comprises a first via plug electrically connected to the source/drain contact, a second via plug, and a wiring line electrically connected to the first via plug and the second via plug,
wherein an upper face of the gate capping pattern is coplanar with an upper face of the gate contact,
wherein the first via plug comprises a single conductive film structure,
wherein an upper face of the first via plug has a convex curved face,
wherein the second via plug further comprises a via barrier film, a lower via filling film on the via barrier film, and an upper via filling film on the lower via filling film,
wherein the upper via filling film overlaps an upper face of the via barrier film in a direction perpendicular to the substrate, and
wherein an upper surface of the via barrier film is lower than an upper surface of the lower via filling film with respect to the substrate.

16. The semiconductor device of claim 15, wherein a material of the upper via filling film is same as a material of the first via plug.

17. The semiconductor device of claim 15,
wherein the via barrier film extends along a bottom face and a side wall of the lower via filling film, and
wherein the upper via filling film overlaps an upper face of the lower via filling film.

18. The semiconductor device of claim 15, wherein the second via plug comprises a multi-conductive film structure.

19. The semiconductor device of claim 15, wherein a top surface of the first via plug is convex curved shaped and is coplanar with a top surface of the second via plug that is convex curved shaped.

20. A semiconductor device comprising:
a gate structure comprising a gate electrode on a substrate;
a source/drain pattern on the substrate;
a source/drain contact electrically connected to the source/drain pattern;
a gate contact electrically connected to the gate electrode; and
a wiring structure electrically connected to the source/drain contact and the gate contact,
wherein the wiring structure comprises a first via plug, a second via plug, and a wiring line electrically connected to the first via plug and the second via plug,
wherein the first via plug comprises a single conductive film structure,
wherein the second via plug comprises a via barrier film, a lower via filling film, and an upper via filling film on the lower via filling film, and
wherein an upper surface of the via barrier film is lower than an upper surface of the lower via filling film with respect to the substrate.

* * * * *